United States Patent
Islam et al.

(10) Patent No.: US 6,714,344 B2
(45) Date of Patent: Mar. 30, 2004

(54) REDUCING OUTPUT NOISE IN A BALLAST-POWERED SEMICONDUCTOR OPTICAL AMPLIFIER

(75) Inventors: Saif M. Islam, Santa Clara, CA (US); Shih-Yuan Wang, Palo Alto, CA (US)

(73) Assignee: Gazillion Bits, Inc., San Jose, CA (US)

( * ) Notice: Subject to any disclaimer, the term of this patent is extended or adjusted under 35 U.S.C. 154(b) by 24 days.

(21) Appl. No.: 10/098,913

(22) Filed: Mar. 15, 2002

(65) Prior Publication Data

US 2003/0067677 A1 Apr. 10, 2003

Related U.S. Application Data

(63) Continuation-in-part of application No. 10/006,435, filed on Dec. 4, 2001, which is a continuation-in-part of application No. 09/972,146, filed on Oct. 4, 2001.

(51) Int. Cl.[7] .............................. H01S 3/00; H01S 5/00
(52) U.S. Cl. ........................................ 359/344; 372/43
(58) Field of Search ................................ 359/344, 333; 372/43

(56) References Cited

U.S. PATENT DOCUMENTS

| | | |
|---|---|---|
| 4,742,307 A | 5/1988 | Thylén |
| 4,751,719 A | 6/1988 | Mito et al. |
| 4,939,474 A | 7/1990 | Eisenstein et al. |
| 4,947,401 A | 8/1990 | Hinata et al. |
| 5,184,247 A | 2/1993 | Schimpe |
| 5,291,328 A | 3/1994 | Devlin et al. |
| 5,436,759 A | 7/1995 | Dijaili et al. |
| 5,604,628 A * | 2/1997 | Parker et al. ............. 359/344 |
| 5,654,822 A | 8/1997 | Ducellier et al. |
| 5,673,141 A | 9/1997 | Gambini |
| 5,793,521 A | 8/1998 | O'Brien et al. |
| 6,249,536 B1 | 6/2001 | Farries et al. |
| 2003/0012246 A1 * | 1/2003 | Klimek et al. ............. 372/70 |

FOREIGN PATENT DOCUMENTS

| | | |
|---|---|---|
| EP | 0623980 A2 * | 9/1994 |
| EP | 0851548 | 7/1998 |
| EP | 0899838 | 3/1999 |
| EP | 1085625 | 3/2001 |
| WO | WO0128049 | 4/2001 |

OTHER PUBLICATIONS

Agrawal and Dutta, *Semiconductor Lasers*, 2nd ed., Kluwer Academic Publishers (1993) at Chapter 5.

(List continued on next page.)

*Primary Examiner*—Mark Hellner
(74) *Attorney, Agent, or Firm*—Cooper & Dunham LLP; Ivan S. Kavrukov

(57) ABSTRACT

A ballast-powered semiconductor optical amplifier (SOA) apparatus and related methods are described. The SOA comprises a signal waveguide for guiding an optical signal along a signal path, and further comprises one or more ballast lasers positioned with respect to the signal waveguide such that the optical signal is amplified using energy from the lasing fields of the one or more ballast lasers. The problem of relative intensity noise (RIN) transfer from the ballast lasers into the optical signal is avoided by ensuring that the relaxation oscillation frequency (ROF) of each ballast laser is sufficiently higher than the signal modulation rate such that the RIN spectrum is tolerably low at the signal modulation rate. The ROFs themselves are manipulated by methods including adjustment of excitation current densities within the ballast lasers. In multiple-ballast laser embodiments, improvements in amplified spontaneous noise (ASE) performance are achieved where the optical signal gain per unit distance is higher near the SOA input and lower near the SOA output. Embodiments are also described in which multi-segment ballast lasers are used and in which operating points are found that satisfy the RIN noise, ASE noise, and output saturation power criteria.

20 Claims, 12 Drawing Sheets

OTHER PUBLICATIONS

Bachmann, M., Doussiere, P., Emery, J., N'Go, R., Pommereau, F., Goldstein, L., Soulage, G., Jourdan, A., "Polarisation–insensitive clamped–gain SOA with integrated spot–size comvertor and DBR gratings for WDM applications at 1.55 ìm wavelength," Electronics Letters, vol. 32, No. 22 (Oct. 24, 1996).

Bernard, J., and Renaud, M., "Tutorial: Semiconductor Optical Amplifers," SPIE's OE Magazine, Sep. 2001, pp. 36–38.

Bordonalli, "High–Performance Phase Locking of Wide Linewidth Semiconductor Lasers by Combined Use of Optical Injection Locking and Optical Phase–Lock Loop," J. Lightwave Tech. vol. 17, No. 2, pp. 328–342 (Feb. 1999).

Charles, P., "On–Wafer Facet Processing for Low Cost Optoelectronic Components," Electronics Letters, vol. 33, No. 16 (Jul 31, 1997).

Dollinger et al., "Ultrashort Low–Loss Optical Multiquantum–well GaAs/GaAlAs Vertical Directional Coupler Switch," Electronics Letters, vol. 32, No. 16 (Aug. 1, 1995).

Doussiere, P., Jourdan, A., Soulage, G., Garabedian, P., Graver, C., Fillion, T., Derouin, E., Leclerc, D., "Clamped gain traveling wave semiconductor optical amplifier for wavelength division multiplexing applications," Proceedings of IEEE 14th International Semiconductor Laser Conference (Cat. No.94CH3379-5), Maui, HI, USA, (Sep. 19–23, 1994), pp. 185–186.

Doussiere, P. et al., "1.55 ìm Polarisation Independent Semiconductor Optical Amplifer with 25 dB Fiber to Fiber Gain," IEEE Photonics Technology Letters, vol. 6, No. 2, pp. 170–172 (feb. 1994).

Duchet, C., et al., "Polarisation insensitive modulator and influence of propagation direction on bulk electroabsorption," Electronics Letters, vol. 33, No. 3, (Jan. 30, 1997).

Francis, et al., "A Single Chip Linear Optical Amplifier," IEEE Optical Fiber Communication Conference, Anaheim, CA (2001).

Francois et al., "Horizontal Directional Coupler Filter Suitable for Integration in a 1.3+/1.3– Duplexer," Electronics Letters, vol. 31, No.23 (Nov. 9, 1995).

Garbuzov, D. et al., "1.5 micrometers wavelength SCH–MQW InGaAsP/InP broadened waveguide laser diodes with low internal loss and high output power," Electronics Letters, vol. 32, No. 18 (Aug. 29, 1996).

Hofling et al., "Short–Cavity Edge–Emitting Lasers With Deeply Etched Distributed Bragg Mirrors," Electronics Letters, vol. 35, No. 2 (Jan. 21, 1999).

Hofstetter et al, "Ridge waveguide DBR laser with nonabsorbing grating and transparent integrated waveguide," Electronics Letters, vol. 31, No. 12, 1995, p. 980.

Ido, T. et al., "Polarization and Wavelength Insensitive MQW Electroabsorption Optical Gates for WDM Switching Systems," IEEE Photonics Technology Letters, vol. 8, No. 6, pp. 788–790 (Jun. 1996).

Ido, T. et al., "Ultra–High–Speed Multiple–Quantum–Well Electro–Absorption Optical Modulators with Integrated Waveguides," Journal of Lightwave Technology, vol. 14, No. 9, pp. 2026–2034 (Sep. 1996).

Joannopoulos, "Molding the Flow of Light," M.I.T. 2001 Physics Annual (2001) at pp. 32–43.

Kawano et al., "4x4 InGaAlAs/InAlAs MQW Directional Coupler Waveguide Switch Modules Integrated with Spot–Size Converters and Their 10 Gb/s Operation," Electronics Letters, vol. 31, No. 2 (Jan. 19, 1995).

Kohtuku, M., et al., InP based 64 channel arrayed waveguide grated with 50 GHz channel spacing and up to —20dB crosstalk, Electronics Letters, vol. 33, No. 21, (Oct. 9, 1997).

Lam et al., "Plasma immersion Ar+ ion implantation induced disorder in strained InGaAsP multiple quantum well," Electronics Letters, vol. 34, No. 8, (Apr. 16, 1998).

Liu et al., "Optical Add/Drop Multiplexers Based on X–Crossing Vertical Coupler Filters," IEEE Photonics Technology Letters, vol. 12, No. 4 (Apr. 2000).

Liu, B., et al., "Fused InP–GaAs vertical coupler filters," IEEE Photonics Technology Letters, vol. 11, No. 1, (Jan. 1999), pp. 93–95.

Loncar et al., "Waveguiding in Planar Photonic Crystals," Applied Physics Letters vol. 77, No. 13 (Sep. 25, 2000) at pp. 1937–1939.

Lullo et. al., "Fabrication of electroabsorption optical modulators using laser disordered GaInAs/GaInAsP multiquantum well structures," Electronics Letters, vol. 30, No. 19, 1994, p. 1623.

Matsumoto, S. et al., "Highly reliable 1.55 micrometers GaInAsP laser diodes buried with semi–insulating iron–doped InP," Electronics Letters, vol. 30, No. 16 (Aug. 4, 1994), pp. 1305–1306.

Morl, L., et. al., "Uncladded InGaAsP/InP rib waveguides with integrated thickness tapers for efficient fibre–chip butt coupling," Electronics Letters, vol. 32, No. 1 (Jan. 4, 1996), pp. 36–38.

Nakamura, T. et al., "High efficiency 0.5W/A at 85 degrees C strained multiquantum well lasers entirely grown by MOVPE on p–InP substrate", Electronics Letters, vol. 34, No. 6 (Mar. 19, 1998).

Ortsiefer, M. et. al., "Room temperature operation of index guided 1.55 micrometers InP based vertical cavity surface emitting laser," Electronics Letters, vol. 36, No. 5 (Mar. 2, 2000).

Ougazzaden, A. et. al., "40 Gb/s Tandem Electro–Absorption Modulator," Optical Fiber Communication Conference and Exhibit, pp. PD14–1 to PD14–3, Optical Society of America, Anaheim, California (Mar. 17–22, 2001).

Samsung Electronics, *GA40B3A 1550 nm Gain Clamped Semiconductor Optical Amplifier Module: Technical Data Sheet*, 10–page technical data sheet from Samsung Electronics Optoelectronics Division (Aug. 2001), available on or before Dec. 3, 2001 at http://samsungelectronics.com/fiberoptics/downloads/ga40b3a.pdf.

Shibata et. al., "Semiconductor Monolithic Wavelength Selective Router Using Grating Switch with Directional Coupler," Electronics Letters, vol. 31, No. 12 (Jun. 8, 1995).

Verbeek, Bart H., "Semiconductor Optical Amplifiers: Basics and Applications," 64–page Booklet handed out at the International Semiconductor Laser Conference 2000, Short Course 3, Monterey, California (IEEE, Sep. 24–28, 2000).

Wiedmann et. al., "Singlemode Operation Of Deeply Etched Coupled Cavity Laser With DBR Facet," Electronics Letters, vol. 36, No. 14, (Jul. 6, 2000).

Zhang, B. et. al., "High speed InGaAsP/InP selective proton bombarded buried cresent lasers with optical field attenuation regions," Electronics Letters, vol. 34, No. 1, (Jan. 8, 1998).

Oct. 1, 2001, Previous News Analysis, "Kamelian to Upstage Genoa"? Amsterdam –ECOC 2001 [European Conference on Optical Communication which takes place in Amsterdam from Sep. 30th to Oct. 4th 2001].

Agrawal, *Semiconductor Lasers*, $2^{nd}$ ed., Van Nostrand Reinhold Publishers (1993) at pp. 258–297.

Giuliani, G. And D'Alessandro, D., "Noise Analysis of Conventional and Gain–Clamped Semiconductor Optical Amplifiers," J. Lightwave Tech., vol. 18, No. 9, pp. 1256–1263 (Sep. 2000).

* cited by examiner

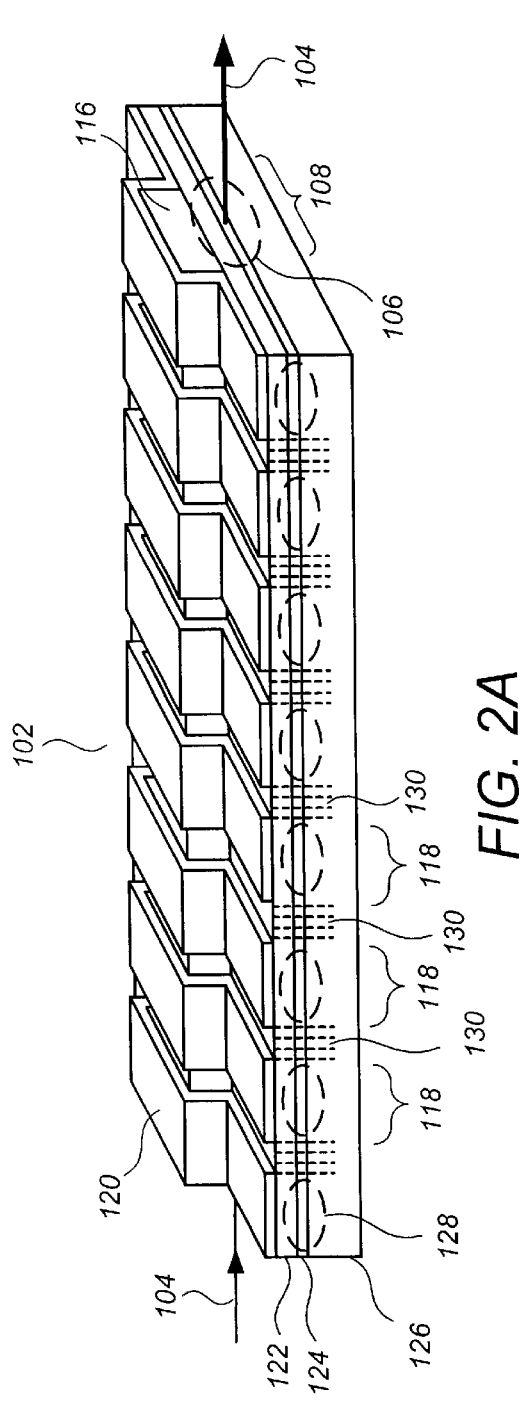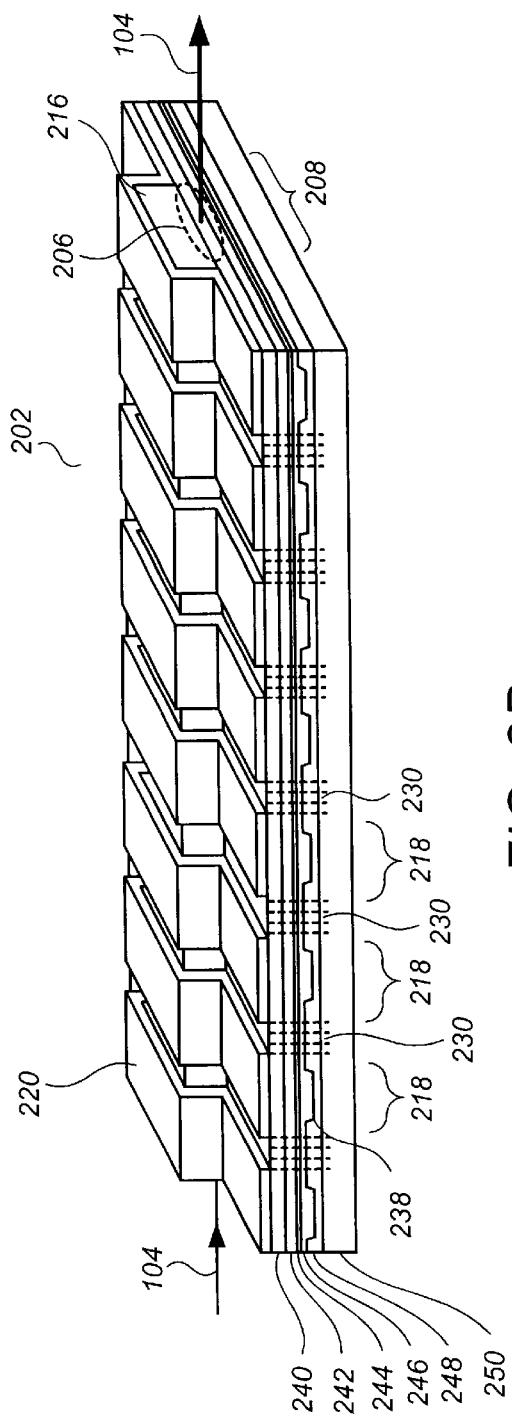

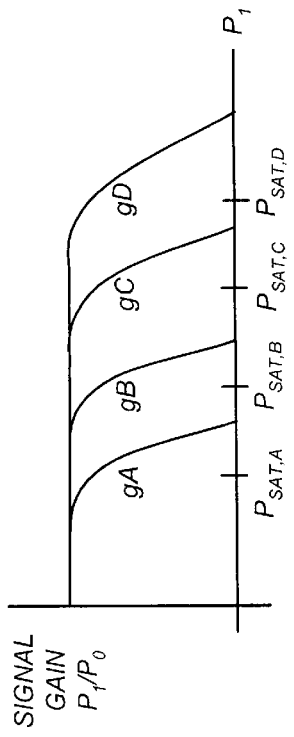
FIG. 3
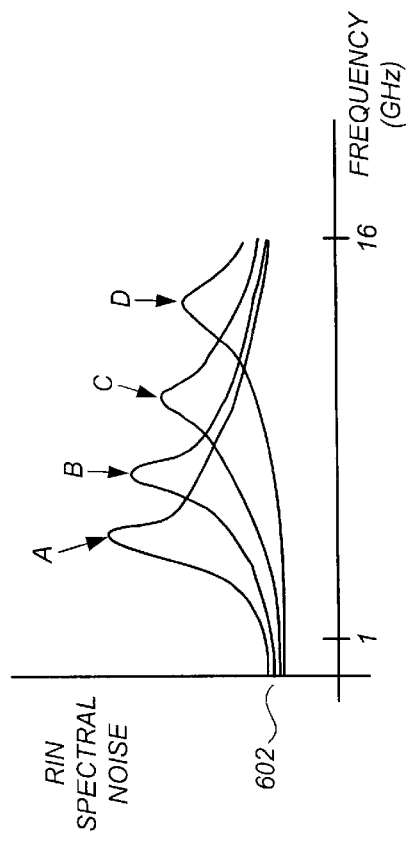
FIG. 5
FIG. 6
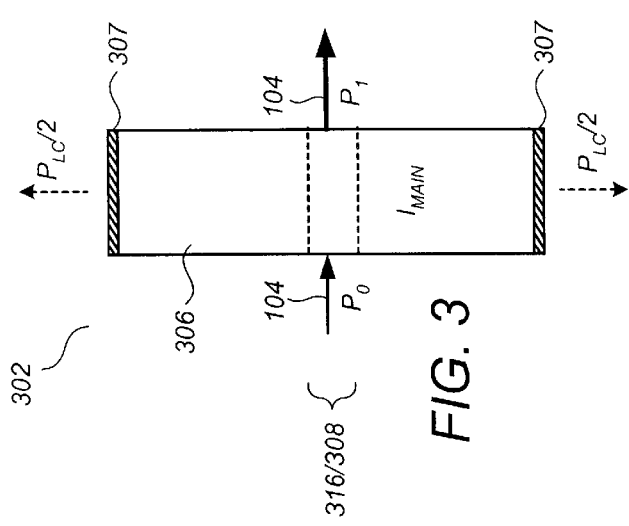
FIG. 4
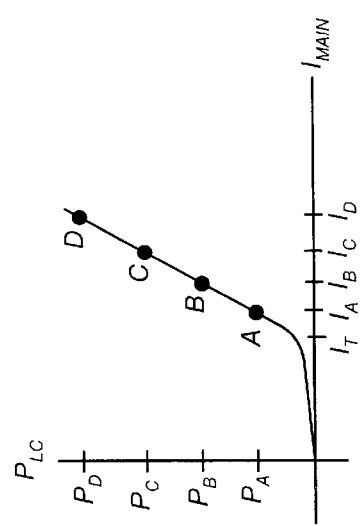

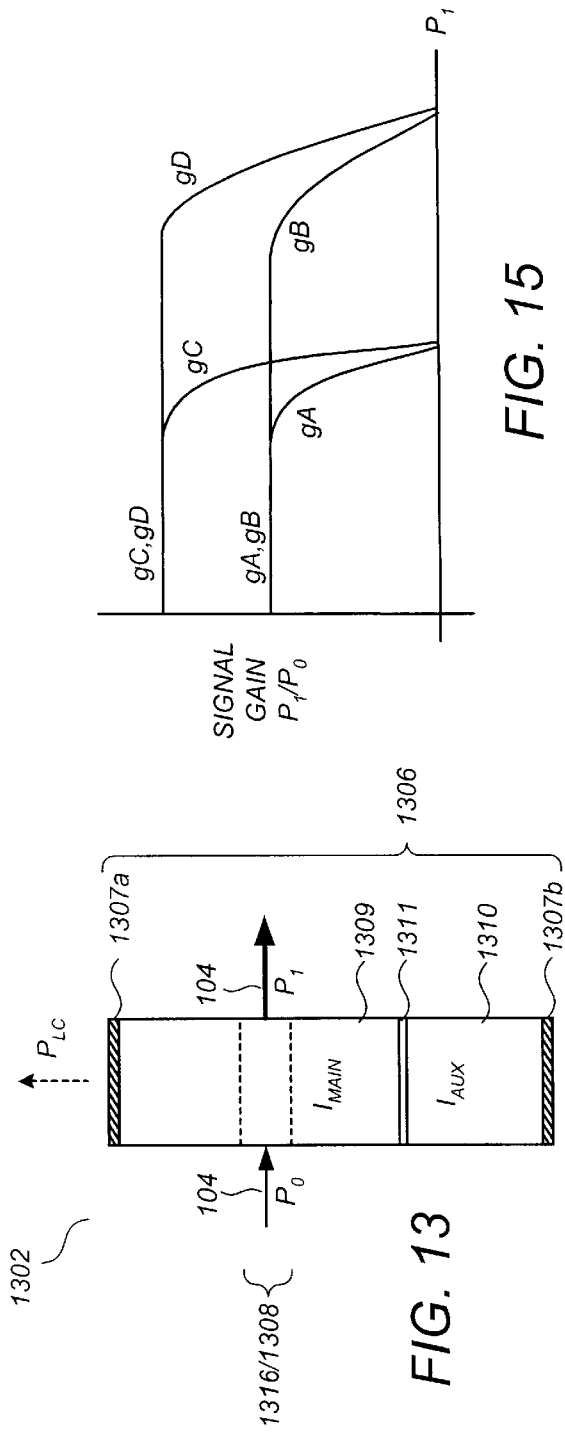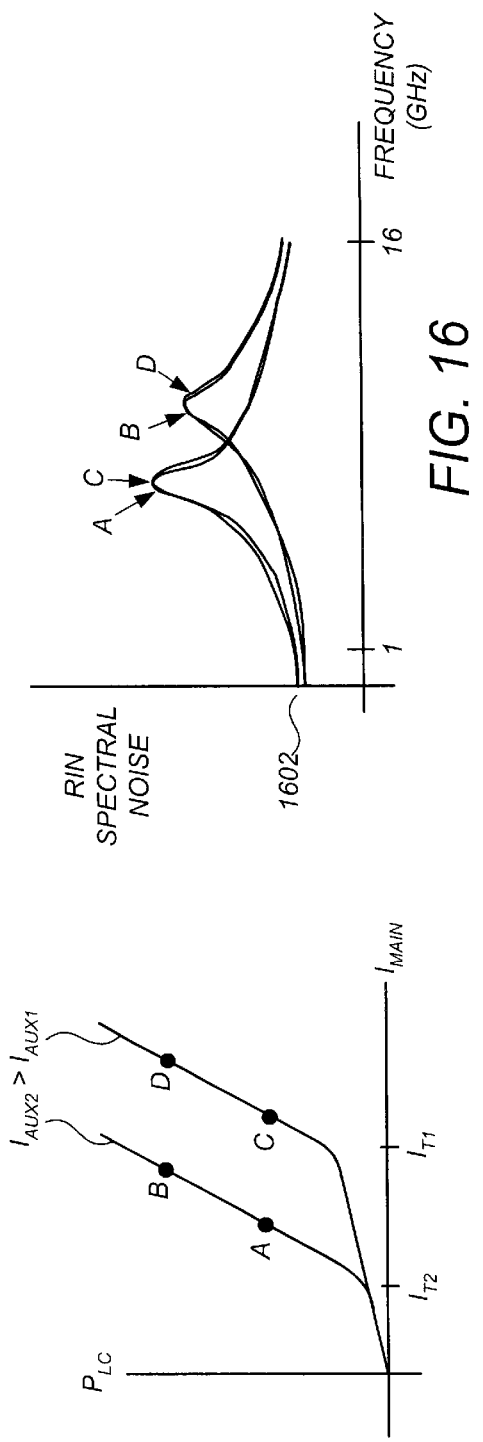

REDUCING OUTPUT NOISE IN A BALLAST-POWERED SEMICONDUCTOR OPTICAL AMPLIFIER

CROSS-REFERENCE TO RELATED APPLICATIONS

This application is a continuation-in-part of U.S. Ser. No. 10/006,435, filed Dec. 4, 2001, which is a continuation-in-part of U.S. Ser. No. 09/972,146, filed Oct. 4, 2001, each of which is incorporated by reference herein.

FIELD

This patent specification relates to optical amplifiers. More specifically, it relates to a semiconductor optical amplifier that amplifies an optical signal using energy from one or more nearby and/or intersecting laser cavities.

BACKGROUND

Efforts continue toward improving the performance of semiconductor optical amplifiers (SOAs) to levels that would allow their increased use in optical communications systems, such as in replacing bulkier and more expensive erbium doped fiber amplifiers (EDFAs). This includes making SOAs with higher power and lower noise characteristics, as well as SOAs having reduced pattern dependent amplitude fluctuations that can cause crosstalk among different channels in a wavelength division multiplexed (WDM) optical communications system. An SOA generally resembles a semiconductor laser structure, except that the end mirrors are replaced by antireflection coatings. In such devices the product of the gain and the reflectivity is less than one so that the device does not oscillate. Rather, the device is used to amplify an incoming optical signal as it passes through the device. Such devices are often called traveling wave amplifiers, which highlights the fact that the optical signal does not pass back and forth within the device, but merely passes through it essentially only once.

One particularly appealing strategy for reducing pattern dependent amplitude fluctuations in an SOA is to place a transverse laser across the SOA such that the laser's gain medium and the SOA's signal gain medium share an overlapping region. The lasing cavity is operated above threshold and the gain of the laser is clamped to overcome the losses of the cavity. As used herein, a laser cavity is gain-clamped and lasing when it is excited by a bias current greater than a threshold current. When the transverse laser is gain-clamped, gain along the SOA signal path is stabilized. The transverse lasing enhances the establishment and maintenance of a population inversion in the overlapping region, resulting in both increased saturation power and a decreased gain recovery time due to increased photon density in the laser cavity. Advantageously, independent lasing only builds up in the transverse direction and does not corrupt the quality of the amplified signal. See generally U.S. Pat. No. 5,436,759; Francis, et. al., "A Single Chip Linear Optical Amplifier," IEEE Optical Fiber Communication Conference, Anaheim, Calif. (2001); Ser. Nos. 09/972,146 and 10/006,435, supra.

In U.S. Ser. No. 09/972,146, supra, a ballast-powered SOA is described comprising a signal waveguide that guides an optical signal along a signal path that intersects with one or more transverse laser cavities, the gain medium of the signal waveguide being integral and coextensive with a gain medium of the transverse laser cavities at regions of intersection therebetween. Gain-stabilized operation is achieved when the transverse laser cavities are biased above threshold. Because it is the lasing fields of the transverse laser cavities that supply the energy for amplifying the optical signal, the transverse laser cavities may be termed ballast lasers, and the SOA may be termed ballast-powered. Successive ballast lasers are separated along the signal path by connecting zones having a higher electrical resistivity than the ballast lasers, providing a measure of electrical isolation therebetween and reducing parasitic lasing modes among them. The ballast lasers are preferably provided with separate bias currents for precise control of gain along the signal path. Additionally, one or more of the ballast lasers may be segmented in the direction of the lasing field into multiple segments with separate electrical contacts. Through careful selection of the bias currents applied to the different segments of successive ballast lasers, the SOA device can be adapted for use in several different applications and/or can achieve improved operating characteristics.

In U.S. Ser. No. 10/006,435, supra, a ballast-powered SOA is described comprising a signal waveguide and one or more transverse ballast lasers, each ballast laser having a gain medium that lies outside the signal waveguide rather than being coextensive with the signal waveguide. The gain medium of the ballast lasers is sufficiently close to the signal waveguide such that, when the gain medium is pumped with an excitation current, the optical signal traveling down the signal waveguide is amplified by an evanescent coupling effect with the ballast lasers. When the gain medium is sufficiently pumped to cause lasing action in the ballast lasers, gain-clamped amplification of the optical signal is achieved. Additional features relating to segmented laser cavities, separate pumping of laser cavity segments, DFB/DBR gratings, current profiling to improve ASE noise performance, coupled-cavity lasers, avoidance of injection locking effects, manipulation of gain curve peaks, integration with a tunable vertical cavity coupler, integration with a photodetector, and integration with an RZ signal modulator are also described. These additional features are applicable to both (i) the SOA with coextensive ballast laser coupling as introduced in Ser. No. 09/972,146, and (ii) the SOA with evanescent ballast laser coupling as introduced in Ser. No. 10/006,435, supra.

Amplified spontaneous emission (ASE) is a troublesome noise source in conventional SOAs. ASE arises from random, spontaneous energy state drops in a small fraction of the excited carriers of the gain medium. Light emitted as a result of these energy state drops is generally random in direction and wavelength. Some of this light will be emitted in the direction of signal propagation and will therefore be amplified as it propagates, resulting in output background noise signal similar to white noise. For good performance, it is generally desirable to keep the amplified signal levels at least 10 dB higher than ASE levels.

Relative intensity noise (RIN) is a troublesome noise source in conventional semiconductor lasers. RIN refers to a random intensity fluctuation in the output of the laser. As the laser operates, new spontaneous emissions occur and some of them can resonate within the cavity and be amplified. This causes some fluctuation in the output power. Of course, RIN noise is not an issue in conventional SOAs because they are not lasers and have no lasing action. However, in ballast-powered SOAs the RIN noise experienced in the transverse ballast lasers can couple into the SOA output signal by virtue of its relationship to the photon density in the laser cavities.

From a signal processing perspective, the effects of RIN noise are fundamentally different from the effects of ASE noise. In particular, whereas ASE noise simply adds to the optical signal as it passes through the SOA, RIN noise actually modulates the optical signal by virtue of the gain fluctuations it imposes. The frequency spectrum of the relevant gain fluctuations generally extends from very low frequencies up to about 16 GHz or more, as showed in the sample RIN spectrum 10 of FIG. 1. The RIN spectrum 10 experiences very low levels (a "noise floor") in the 0.01–0.1 GHz range, but begins to rise more quickly in the low-GHz range, and then reaches a RIN peak 12 at a relaxation oscillation frequency (ROF) 14 of the laser, a consequence of the laser's intrinsic resonance. The RIN spectrum 10 then falls off again as the frequency increases further beyond the relaxation oscillation frequency (ROF) 14. The relaxation oscillation frequency (ROF) 14 is usually somewhere between 3 and 16 GHz or more depending on the laser design and the photon density.

The relaxation oscillation frequency (ROF) 14, the shape of the RIN peak 12, and the overall location and vertical position of the RIN spectrum 10 depend on the particular characteristics of the laser such as facet reflectivity, material characteristics, etc. Importantly, however, changes in the relaxation oscillation frequency (ROF) 14, the RIN peak 12, and the overall RIN spectrum 10 occur as the specific operating point of the laser changes. Generally speaking, the relaxation oscillation frequency (ROF) 14 shifts to the right as the current density through the laser's gain medium is increased, while the height of the overall RIN spectrum 10 and the severity of the RIN peak 12 decrease with increased laser output power. See generally Agrawal, *Semiconductor Lasers*, 2nd ed., Van Nostrand Reinhold Publishers (1993) at pp. 258–297.

It would be desirable to provide a ballast-powered semiconductor optical amplifier (SOA) for use in an optical communications system, wherein bit errors caused by relative intensity noise (RIN) in the ballast-powered SOA are maintained at acceptably low levels.

It would be further desirable to provide such a ballast-powered semiconductor optical amplifier (SOA) in which amplified spontaneous emission (ASE) is also maintained at acceptably low levels.

SUMMARY

According to a preferred embodiment, a ballast-powered semiconductor optical amplifier (SOA) apparatus and related methods are provided for amplifying an optical signal having a first modulation rate, the SOA comprising a signal waveguide that guides the optical signal along an optical signal path, the SOA further comprising a ballast laser positioned with respect to the optical signal path such that the optical signal is amplified using energy from the lasing field of the ballast laser, wherein the ballast laser is biased by an excitation current sufficient to cause relative intensity noise (RIN) in an SOA output to be at acceptably low levels. More particularly, the excitation current is maintained at a level greater than a predetermined RIN threshold current, the RIN threshold current corresponding to an excitation current that yields a relaxation oscillation frequency (ROF) sufficiently greater than the first modulation rate such that a RIN spectrum value at the first modulation rate is equal to a predetermined tolerance amount above a low-frequency RIN noise floor. In one preferred embodiment this predetermined tolerance amount is at least 6 dB/Hz. The excitation current of the ballast laser must also be greater than a lasing threshold sufficient to cause lasing in the ballast laser.

In another preferred embodiment, the ballast laser of the SOA is biased by an excitation current sufficient to result in an SOA output saturation power greater than a nominal output saturation power of the SOA. In particular, the excitation current is maintained at a level greater than a predetermined saturation threshold current, the saturation threshold current corresponding to an excitation current that yields an output saturation power equal to the nominal SOA saturation output power. In another preferred embodiment, the excitation current of the ballast laser is maintained at a level not less than the greatest of (i) the lasing threshold current, (ii) the RIN threshold current, and (iii) the saturation threshold current.

According to another preferred embodiment, the ballast laser is segmented into multiple segments including a main segment whose lasing field energy couples with the optical signal and an auxiliary segment, the main segment and auxiliary segment being optically contiguous but electrically isolated and provided with separate excitation currents. The auxiliary segment excitation current is set at a level corresponding to a desired gain of the SOA, while the main segment excitation current is maintained at a level not less than the greatest of (i) a predetermined lasing threshold current sufficient to cause lasing in the ballast laser for that gain level, (ii) a predetermined RIN threshold current that yields an ROF sufficiently greater than the first modulation rate such that a RIN spectrum value at the first modulation rate is equal to a predetermined tolerance amount above a low-frequency RIN noise floor for that gain level, and (iii) a predetermined saturation threshold current corresponding to an excitation current that yields an output saturation power equal to the nominal SOA saturation output power.

According to another preferred embodiment, the SOA comprises multiple ballast lasers positioned along the optical signal path, each ballast laser being associated with a corresponding amplifier stage along the signal path. The multiple ballast lasers include a first ballast laser associated with a first amplifier stage having a first signal gain per unit distance therethrough, and further include a second ballast associated with a second amplifier stage having a second signal gain per unit distance therethrough, the first amplifier stage being located nearer to an SOA signal input than the second amplifier stage, wherein the first signal gain per unit distance is greater than the second signal gain per unit distance. For a fixed amount of signal amplification collectively yielded by said first and second amplifier stages, amplified spontaneous emission (ASE) noise in the SOA output is reduced as compared to a configuration in which said first and second signal gains per unit distance are the same.

According to another preferred embodiment, each amplifier stage positioned nearer the SOA signal input yields a signal gain per unit distance greater than that of each amplifier stage positioned farther from the SOA signal input. In another preferred embodiment, each of the multiple ballast lasers comprises multiple segments including a main segment and an auxiliary segment, the auxiliary segment excitation current being set to a level corresponding to a desired gain for that amplifier stage, the main segment excitation current being maintained at a level not less than the greatest of (i) a predetermined lasing threshold current sufficient to cause lasing in that ballast laser for that amplifier stage gain level, (ii) a predetermined RIN threshold current that yields an ROF sufficiently greater than the first modulation rate such that a RIN spectrum value at the first modulation rate is equal to a predetermined tolerance amount above a low-frequency RIN noise floor for that amplifier stage gain level, and (iii) a predetermined saturation threshold current corresponding to a main segment excitation current that yields an output saturation power for that amplifier stage equal to the nominal saturation output power for that amplifier stage for that amplifier stage gain level.

BRIEF DESCRIPTION OF THE DRAWINGS

FIG. 2A illustrates a ballast powered semiconductor optical amplifier (SOA) in accordance with a preferred embodiment;

FIG. 2B illustrates a ballast powered SOA in accordance with a preferred embodiment;

FIG. 3 illustrates a ballast powered SOA in accordance with a preferred embodiment;

FIG. 4 illustrates a conceptual plot of emitted ballast laser power versus excitation current in the SOA of FIG. 3;

FIG. 5 illustrates conceptual plots of SOA gain versus output signal power in the SOA of FIG. 3 at different operating points;

FIG. 6 illustrates conceptual plots of the RIN spectrum of the ballast laser of the SOA of FIG. 3 at different operating points;

FIG. 13 illustrates a ballast powered SOA in accordance with a preferred embodiment;

FIG. 14 illustrates conceptual plots of emitted ballast laser power versus main segment excitation current in the SOA of FIG. 13 for differing auxiliary segment excitation currents at different operating points;

FIG. 15 illustrates conceptual plots of SOA gain versus output signal power in the SOA of FIG. 13 at different operating points;

FIG. 16 illustrates conceptual plots of the RIN spectrum of the ballast laser of the SOA of FIG. 3 at different operating points;

DESCRIPTION

Figure 1:
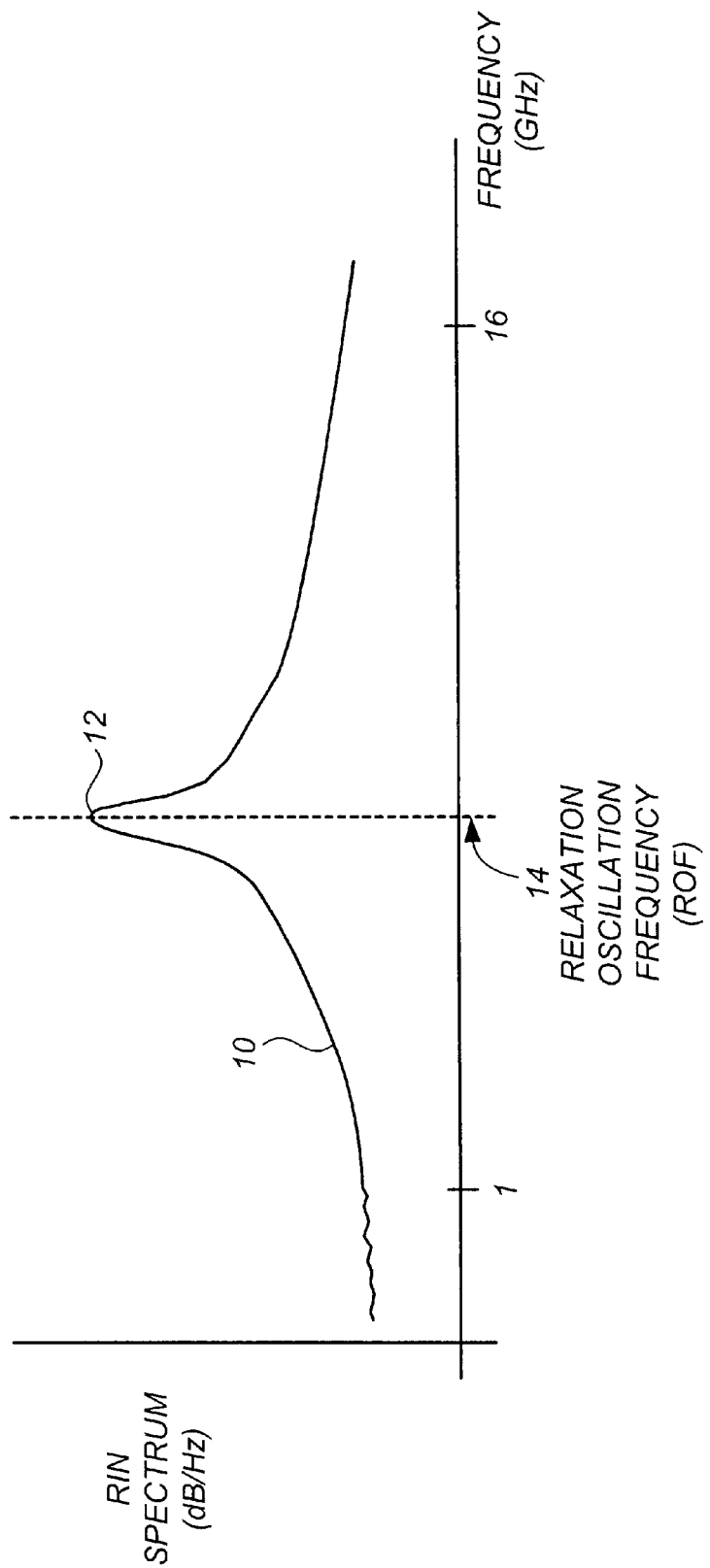
FIG. 1 illustrates a conceptual plot of a relative intensity noise (RIN) spectrum of a laser.

FIG. 2A illustrates a simplified perspective view of a multi-stage ballast-powered semiconductor optical amplifier (SOA) 102 in accordance with a preferred embodiment, comprising a signal waveguide having a signal guiding layer that comprises a gain medium, and further comprising one or more transverse ballast lasers whose gain medium is coextensive with the gain medium of the signal guiding layer at one or more regions of intersection between the signal waveguide and the one or more ballast lasers. Thus, an optical signal traveling along the signal waveguide is amplified using energy provided by the one or more transverse ballast lasers. The respective intersections between the signal waveguide and the transverse ballast lasers represent distinct amplification stages for the optical signal traveling along the signal waveguide.

SOA 102 receives an optical signal 104 at an input, guides the optical signal 104 along a signal waveguide 108 while also amplifying it, and provides an amplified version of the optical signal 104 at an output. Shown by dotted lines in FIG. 2A is an optical path 106, which generally represents a field pattern of the optical signal 104 as it propagates down the signal waveguide 108. Signal waveguide 108 is formed by a signal gain medium 124, an upper cladding layer 122, a lower cladding layer 126, and a ridge element 116 as shown in FIG. 2A. The signal gain medium 124 has an index of refraction that is slightly higher than the indices of refraction of the upper and lower cladding layers 122 and 126, respectively, to provide vertical confinement of the optical signal 104. The presence of ridge element 116, which may comprise material similar to that of upper cladding layer 112, provides for horizontal confinement of the optical signal 104.

Running transverse to the signal waveguide 108 are a plurality of ballast lasers 118 sharing the same material layers 122 (upper cladding), 124 (gain medium), and 126 (lower cladding) with the signal waveguide 108. Each ballast laser 118 comprises an upper ohmic contact 120 and a lower ohmic contact (not shown) for supplying excitation current through the gain medium of the ballast laser 118, and further comprises partially reflective end mirrors (not shown). A lasing field 128, represented by dotted lines in FIG. 2A, builds up in the transverse direction when the excitation current exceeds a lasing threshold current. Also shown in FIG. 2A are implanted zones 130 that electrically separate adjacent ballast lasers, these zones being disordered where they encounter the optical signal path to provide optical transparency for the optical signal 104. By way of example, the ridge element 116 and upper cladding layer 122 may comprise p-doped indium phosphide (p-InP), the gain medium 124 may comprise bulk active indium gallium arsenide phosphide, e.g., $In_{0.7}Ga_{0.3}As_{0.7}P_{0.3}$, or multiple quantum wells (MQWs) according to a InGaAsP/InGaAs/InP material system, and the lower cladding layer 126 may comprise n-doped indium phosphide (n-InP), these layers being formed on top of an indium phosphide (InP) substrate (not shown).

While the ballast lasers of the SOA 102 of FIG. 2A each comprise only a single segment between their end mirrors, each may be segmented into multiple segments, the multiple segments being optically contiguous but electrically distinct from each other and provided with separate excitation currents. As used herein, the term main segment denotes the segment that intersects with the signal waveguide 108, while the term auxiliary segment denotes a different segment that does not intersect with the signal waveguide 108. It is to be appreciated that many different types of ballast powered SOAs having coextensive signal waveguide gain media and ballast laser gain media may be used in accordance with the preferred embodiments, including those described in U.S. Ser. No. 09/972,146, supra, and other ballast powered SOAs.

FIG. 2B illustrates a simplified perspective view of a ballast-powered semiconductor optical amplifier (SOA) 202 in accordance with a preferred embodiment, comprising a signal waveguide including a signal guiding layer, and further comprising one or more transverse ballast lasers, each transverse ballast laser having an active layer that is separated from the signal guiding layer but positioned sufficiently near the signal guiding layer such that an optical signal propagating along the signal guiding layer is amplified by an evanescent coupling effect with the active layer. Thus, an optical signal traveling along the signal waveguide is amplified using energy provided by the one or more transverse ballast lasers. The respective regions in which the evanescent coupling takes place, termed amplification regions herein, represent distinct amplification stages for the optical signal traveling along the signal waveguide.

SOA 202 comprises a signal guiding layer 240, a ridge element 216, and a first cladding layer 242 positioned as shown in FIG. 2B, the guiding layer 240 having a refractive index that is higher than the refractive indices of the ridge element 216 and the first cladding layer 242 such that the optical signal 104 is vertically confined. By way of example, the guiding layer 240 comprises passive waveguiding p-doped indium gallium arsenide phosphide, e.g., $In_{0.95}Ga_{0.05}As_{0.1}P_{0.9}$, while the ridge element 216 and first cladding layer 242 comprise p-doped indium phosphide (p-InP). It is to be appreciated, however, that other material systems having the appropriate characteristics may be used. Ridge element 216 also provides for horizontal confinement of the optical signal 104, such that an optical path 206 generally follows underneath the ridge element 216 between the input and the output of the SOA 202. Collectively, the guiding layer 240, the ridge element 216, and the first cladding layer 242 form a signal waveguide 208 defining the optical path 206 as indicated in FIG. 2B.

SOA 202 further comprises a gain medium layer 244, a laser waveguiding layer 246, and a second cladding layer 248 positioned as shown in FIG. 2B. Gain medium layer 244 may interchangeably be called an active layer herein. For each ballast laser 218, the laser waveguiding layer 246 and second cladding layer 248 are shaped to form a rib element 238 longitudinally extending from one end mirror (not shown) of the ballast laser to the other (also not shown). Gain medium layer 244 has a refractive index greater than the refractive index of the first cladding layer 242 and similar to the refractive index of the laser waveguiding layer 246, which in turn has a refractive index greater than the refractive index of the second cladding layer 248. By way of example, the gain medium layer 244 comprises bulk active indium gallium arsenide phosphide, e.g., $In_{0.7}Ga_{0.3}As_{0.7}P_{0.3}$, or may comprise multiple quantum wells (MQWs) according to a InGaAsP/InGaAs/InP material system. The laser waveguiding layer 246 comprises passive waveguiding n-doped indium gallium arsenide phosphide, e.g., $In_{0.95}Ga_{0.05}As_{0.1}P_{0.9}$, and the second cladding layer 248 comprises n-doped indium phosphide (n-InP), these layers being formed on top of an indium phosphide (InP) substrate 250. Again, however, other material systems having the appropriate characteristics may be used.

As with the SOA of FIG. 2A, the ballast lasers of the SOA 102 of FIG. 2B may be segmented into multiple segments, the multiple segments being optically contiguous but electrically distinct from each other and provided with separate excitation currents, the multiple segments including a main segment that passes near the signal waveguide 208, the multiple segments further including an auxiliary segment that does not pass near the signal waveguide 208. It is to be appreciated that many different types of ballast powered SOAs having evanescently-coupled signal waveguides and ballast laser active layers may be used in accordance with the preferred embodiments, including those described in U.S. Ser. No. 10/006,435, supra, and other ballast powered SOAs.

FIG. 3 illustrates a top conceptual view of a single-segment, single-stage ballast powered SOA 302 according to a preferred embodiment. The SOA 302 comprises a signal waveguide 308 that guides the optical signal 104 from an input to an output, with lateral confinement being provided by a ridge element 316. The ridge element 316 and signal waveguide 308 are represented by dotted lines in FIG. 3 to allow a clear representation of a ballast laser 306 extending between two end mirrors 307. A single excitation current denoted $I_{MAIN}$ is provided to the ballast laser 306. The emitted laser cavity output light, which generally remains unused and has a total power of $P_{LC}$, is split equally between the two end mirrors, although in other preferred embodiments this light may be emitted in other ratios or may be emitted entirely out of one end mirror. The input optical signal has a power denoted $P_0$ while the output optical signal has a power denoted $P_1$. The vertical material structure of the SOA 302 may be similar to any given amplification stage of the multi-stage ballast lasers of FIG. 2A or FIG. 2B.

FIG. 4 illustrates a conceptual plot of emitted ballast laser power $P_{LC}$ versus excitation current $I_{MAIN}$ in the SOA of FIG. 3. It is to be appreciated that the plot of FIG. 4, which is presented for clarity of disclosure, is a conceptual one and that a "real-world" curve will not, of course, be as "clean" as this curve. In general, however, the curve of $P_{LC}$ versus $I_{MAIN}$ will rise slowly when $I_{MAIN}$ is less than a lasing threshold $I_T$, and then will rise sharply as the ballast laser begins to lase. For purposes of describing the interactions of excitation current, gain, and relative intensity noise, four exemplary operating points A, B, C, and D having increasingly large excitation currents $I_A$, $I_B$, $I_C$, and $I_D$ are shown.

FIG. 5 illustrates conceptual plots of SOA gain $g=P_1/P0$ versus output signal power $P_1$ for the SOA of FIG. 3 at the different operating points A, B, C, and D. It is to be appreciated that the plots of FIG. 5, which are presented for clarity of disclosure, are conceptual ones and that "real-world" gain curves will not, of course, be as "clean" as these curves. In general, however, as long as the excitation currents are above the threshold current $I_T$ for the ballast laser, the signal gains $g_A$, $g_B$, $g_C$, and $g_D$ will be about the same until output saturation is reached. The output saturation powers themselves, represented by $P_{SATA}$, $P_{SATB}$, $P_{SATC}$, and $P_{SATD}$, increase with increasing excitation current.

FIG. 6 illustrates conceptual plots of the RIN spectrum of the ballast laser of the SOA of FIG. 3 at the different operating points A, B, C, and D. It is to be appreciated that the plots of FIG. 6, which are presented for clarity of disclosure, are conceptual ones and that "real-world" RIN spectra will not, of course, be as "clean" as these curves. In general, however, each RIN spectrum curve will have a low-frequency noise floor that can be identified at low frequencies less than about 1 GHz. The RIN spectrum curve will increase in a generally monotonic manner until a peak is reached at the relaxation oscillation frequency (ROF), and will then decrease generally monotonically past the ROF. The units for the modulation rate on the horizontal axis of FIG. 6 are usually GHz, while the units for the RIN spectrum values on the vertical axis of FIG. 6 are usually dB/Hz.

As indicated by the progression of curves in FIG. 6, the ROF tends to increase as the excitation current density through the ballast laser's gain medium is increased, while the height of the overall RIN spectrum and the severity of its peak decrease with increased laser output power. Notably, even if the RIN spectrum of the ballast laser is not so "well-behaved" as the conceptual curves of FIG. 6 indicate, it will be readily apparent that the features and advantages of the preferred embodiments are readily applicable.

In an optical communications system having a binary modulation scheme, any RIN noise coupling into the optical signal 104 from the ballast laser 306 will generally not be a problem if the modulation rate $F_{MOD}$ of the optical signal is substantially below the ROF, i.e., $F_{MOD}<<ROF$. This is because any RIN-induced oscillations in the envelope of the optical signal 104 will occur at frequencies substantially higher than the signal modulation rate $F_{MOD}$, and would be readily filtered out when the optical signal is received. Accordingly, where $F_{MOD}<<ROF$, there is little chance that a "1" will be mistaken as a "0" at the photodetector due to RIN noise. However, if the signal modulation rate $F_{MOD}$ is closer to the ROF, i.e., $F_{MOD}\approx ROF$, substantial RIN-induced oscillations in the envelope of the optical signal are occurring at a rate similar to the signal modulation rate itself, causing substantial bit errors at the receiving end. Likewise, if the signal modulation rate $F_{MOD}$ is greater than the ROF peak, i.e., $F_{MOD}>>ROF$, the RIN-induced oscillations are occurring at a rate slower than the signal modulation rate, and therefore could potentially wipe out entire sequences of "1s" in the data stream, causing unacceptable error rates.

According to a preferred embodiment, the excitation current $I_{MAIN}$ is maintained at a level greater than a predetermined RIN threshold current $I_{MAINRINTHRESH}$, the RIN threshold current $I_{MAINRINTHRESH}$ corresponding to the excitation current $I_{MAIN}$ needed to yield an ROF sufficiently greater than the signal modulation rate $F_{MOD}$ such that a RIN spectrum value at $F_{MOD}$ is equal to a predetermined tolerance amount above the low-frequency RIN noise floor. This will be illustrated further with respect to FIGS. 9 and 12 infra. In one preferred embodiment this predetermined tolerance amount is at least 6 dB/Hz.

The excitation current $I_{MAIN}$ should also meet two other criteria. First, $I_{MAIN}$ should of course be greater than the lasing threshold current $I_T$ so that lasing action occurs in the ballast laser 306, a condition that is most often inherently satisfied if $I_{MAIN}$ is already greater than $I_{MAINRINTHRESH}$. Second, the excitation current $I_{MAIN}$ should be sufficient to result in an SOA output saturation power greater than a nominal output saturation power of the SOA. Stated another way, the excitation current $I_{MAIN}$ should be not less than a saturation threshold current $I_{MAINSATTHRESH}$, where $I_{MAINSATTHRESH}$ is that excitation current $I_{MAIN}$ needed to result in an output saturation power $P_{SAT}$ equal to the nominal output saturation power. Thus, according to a preferred embodiment, the excitation current of the ballast laser $I_{MAIN}$ is maintained at a level not less than the greatest of (i) the lasing threshold current $I_T$, (ii) the RIN threshold current $I_{MAINRINTHRESH}$, and (iii) the saturation threshold current $I_{MAINRINTHRESH}$. In practice, depending on the specific parameters involved, the proper operating point of the SOA 302 will either be closer to the RIN-limited operating point ($I_{MAIN}\approx I_{MAINRINTHRESH}$) or to the saturation-limited operating point ($I_{MAIN}\approx I_{MAINSATTHRESH}$).

Figure 8:
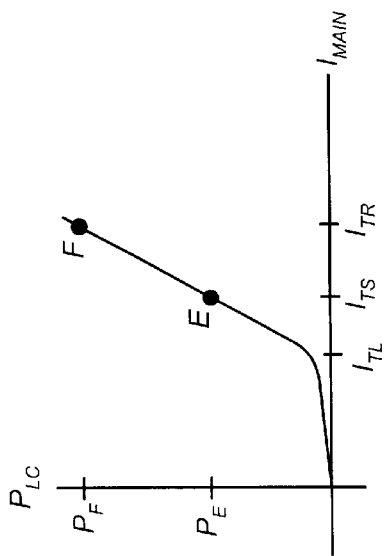
FIG. 8 illustrates a conceptual plot of emitted ballast laser power versus excitation current in the SOA of FIG. 3.
Figure 7:
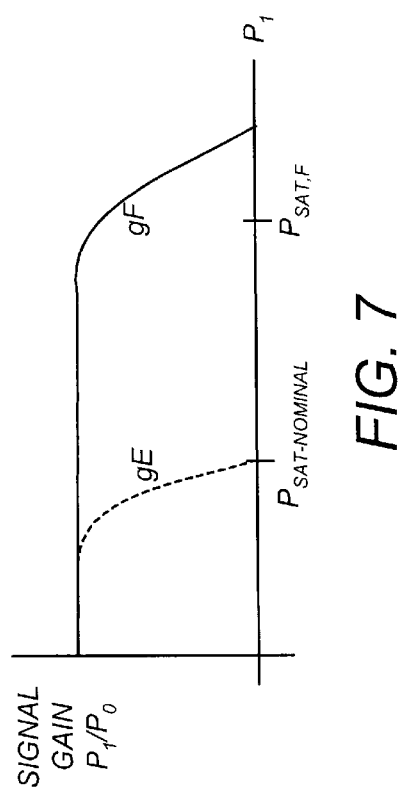
FIG. 7 illustrates conceptual plots of SOA gain versus output signal power in the SOA of FIG. 3 at different operating points.
Figure 9:
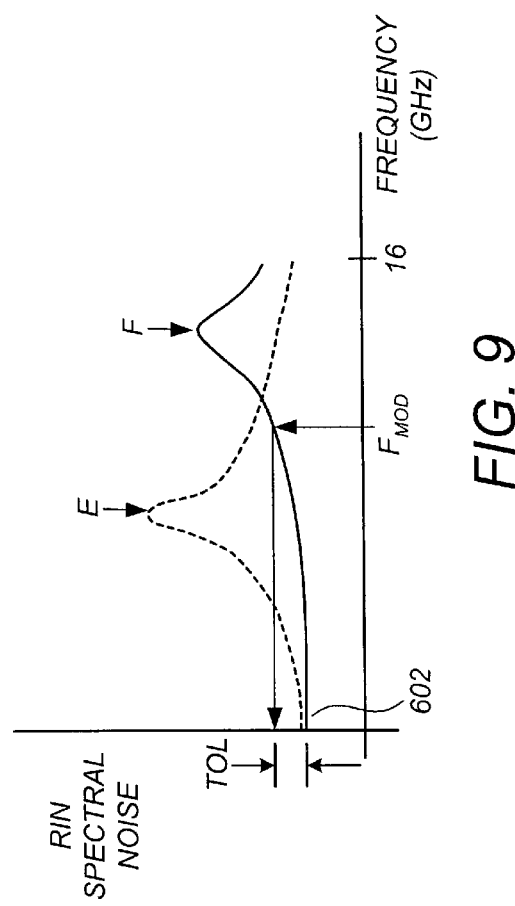
FIG. 9 illustrates conceptual plots of the RIN spectrum of the ballast laser of the SOA of FIG. 3 at different operating points.

FIGS. 7–9 illustrate conceptual plots of signal gain versus output saturation power, ballast laser output power versus excitation current, and RIN spectra, respectively, for the ballast-powered SOA 302 at two operating points E and F that illustrate a RIN-limited operating point. Determination of the proper operating points is generally performed in view of a known signal modulation rate $F_{MOD}$, a known desired signal gain G, and a known desired nominal output saturation power $P_{SAT-NOMINAL}$. For the single-segment, single-stage, ballast-powered SOA 302, the signal gain G will depend on the static device dimensions, materials, doping levels, etc., and will generally not be dynamically adjustable or user adjustable. Thus, for the purposes of the preferred embodiments of FIGS. 7–9, it is presumed that the fixed gain value G (the height of the gain curves $g_E$ and $g_F$ of FIG. 7) is already at the desired level. A first operating point E having an excitation current $I_{TS}=I_{MAINSATTHRESH}$ is determined that results in an output saturation power equal to $P_{SAT-NOMINAL}$. With the saturation criterion satisfied, it is then determined whether RIN noise performance will be tolerable for the operating point E. Unfortunately, as shown in FIG. 9, the associated RIN spectrum for operating point E peaks at an ROF that is less than the modulation rate FMOD. Therefore, the operating point E does not meet the RIN noise criterion. The excitation current $I_{MAIN}$ needs to be increased so as to shift the RIN spectrum curve down and to the right in FIG. 9, until the RIN spectrum value at $F_{MOD}$ exceeds the low-frequency noise floor 602 by a predetermined tolerance amount TOL (e.g., by +6 dB/Hz). The excitation current $I_{MAIN}$ that yields the curve "F" in FIG. 9 is equal to the RIN threshold current $I_{TR}=I_{MAINRINTHRESH}$. The operating point F is also shown in FIG. 8 and the corresponding gain curve gF is shown in FIG. 7. As expected, the output saturation power $P_{SAT,F}$ now comfortably exceeds the nominal output saturation power $P_{SAT-NOMINAL}$. Thus, both the output saturation criterion and the RIN criterion (as well as the lasing threshold criterion) are satisfied. Notably, the order of determination can be changed and would yield a similarly valid result, e.g., the RIN criterion can first be satisfied and the result then checked against the saturation criterion.

Figure 11:
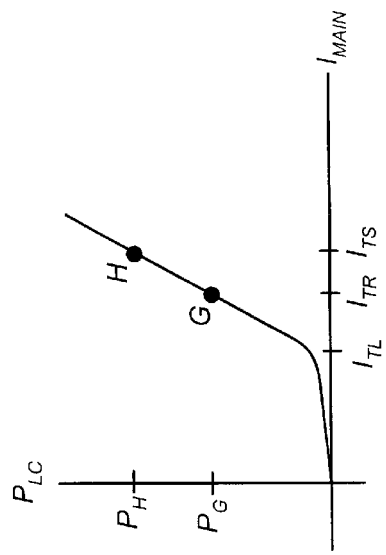
FIG. 11 illustrates a conceptual plot of emitted ballast laser power versus excitation current in the SOA of FIG. 3.
Figure 10:
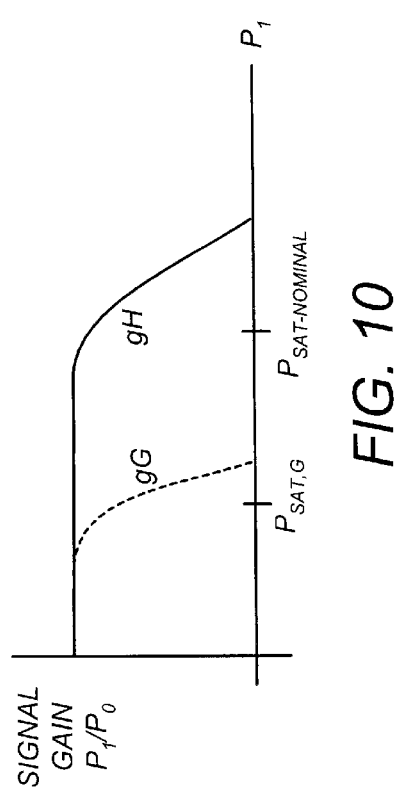
FIG. 10 illustrates conceptual plots of SOA gain versus output signal power in the SOA of FIG. 3 at different operating points.
Figure 12:
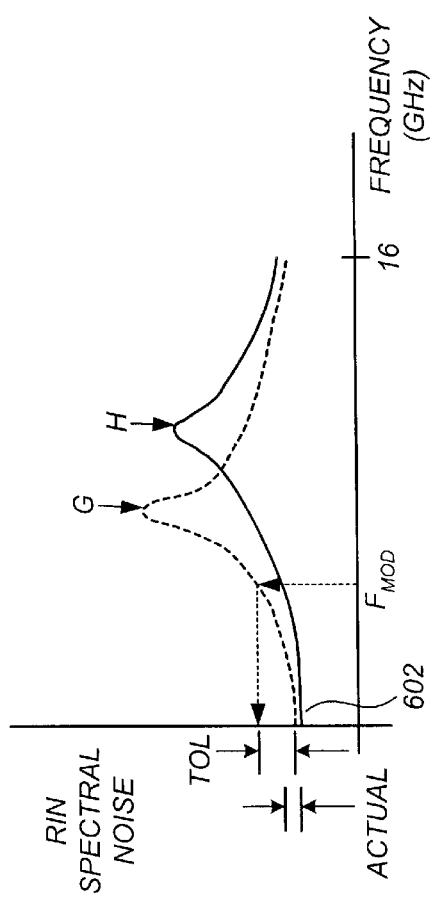
FIG. 12 illustrates conceptual plots of the RIN spectrum of the ballast laser of the SOA of FIG. 3 at different operating points.

FIGS. 10–12 illustrate conceptual plots of signal gain versus output saturation power, ballast laser output power versus excitation current, and RIN spectra, respectively, for the ballast-powered SOA 302 at two operating points G and H that illustrate an output saturation power limited operating point. A first operating point G is determined having an excitation current $I_{TR}=I_{MAINRINTHRESH}$ sufficient to cause the ROF to be sufficiently greater than $F_{MOD}$ such that the RIN spectrum value at $F_{MOD}$ is equal to TOL dB above the low-frequency noise floor (see FIG. 12). With the RIN criterion satisfied, it is then determined whether the output saturation power will be sufficient at this excitation current level. Unfortunately, as shown in FIG. 10, the associated gain curve gG for operating point G shows saturation at a level $P_{SAT,G}$ that is less than the nominal output saturation power $P_{SAT-NOMINAL}$. Therefore, the operating point G does not meet the output saturation power criterion. The excitation current needs to be increased so as to shift the saturation point of the gain curve to the right in FIG. 10 until the saturation power is equal to $P_{SAT-NOMINAL}$. This is achieved for an excitation current $I_{TS}=I_{MAINSATTHRESH}$ at an operating point H. The operating point H is also shown in FIG. 12, and, as expected, the RIN spectrum has been moved further to the right and the RIN spectrum value at $F_{MOD}$ is even lower. Thus, both the output saturation criterion and the RIN criterion (as well as the lasing threshold criterion) are satisfied.

FIG. 13 illustrates a top conceptual view of a multi-segment, single-stage, ballast powered SOA 1302 according to a preferred embodiment. Similar to the SOA 302 of FIG. 3, the SOA 1302 comprises a signal waveguide 1308 that guides the optical signal 104 from an input to an output, with lateral confinement being provided by a ridge element 1316, the ridge element 1316 and signal waveguide 1308 being represented by dotted lines to allow a clear representation of a ballast laser 1306 extending between two end mirrors 1307a and 1307b. However, the ballast laser 1306 comprises multiple optically contiguous, electrically isolated segments including a main segment 1309 and an auxiliary segment 1310 separated by an inter-segment region 1311. The inter-segment region 1311 is ion implanted (e.g., proton, helium) to provide electrical isolation between the main segment 1309 and the auxiliary segment 1310. If required, the inter-segment region 1311 is also disordered to reduce its contribution to lasing signal attenuation. If the active length and modal gain of the ballast laser 1306 are sufficiently large, the adjacent segments 1309/1310 behave in an optically contiguous manner even if the inter-segment region is not disordered. The main segment 1309 passes over (see FIG. 2B) or through (see FIG. 2A) the signal waveguide 1308 whereas the auxiliary segment 1310 does pass over or through the signal waveguide 1308. The main segment 1309 and auxiliary segment 1310 receive separate, distinct excitation currents $I_{MAIN}$ and $I_{AUX}$ that are separately adjustable. The emitted laser cavity output light has a total power of $P_{LC}$ and is output through a single one of the end mirrors, although in other preferred embodiments this light may be emitted out both mirrors in differing ratios. The input optical signal has a power denoted $P_0$ while the output optical signal has a power denoted $P_1$.

FIG. 14 illustrates conceptual plots of emitted ballast laser power $P_{LC}$ versus excitation current $I_{MAIN}$ in the SOA of FIG. 13 for two different auxiliary excitation currents $I_{AUX1}$ (operating points C, D) and $I_{AUX2}$ (operating points A, B). FIG. 15 illustrates conceptual plots of SOA gain $P_1/P_0$ versus output signal power $P_1$ for the SOA of FIG. 13 at the different operating points A, B, C, and D. FIG. 16 illustrates conceptual plots of the RIN spectrum of the ballast laser 1306 of the SOA of FIG. 13 at the different operating points A, B, C, and D. As indicated in FIG. 14, the main segment threshold current $I_T$ necessary to cause lasing in the ballast laser 1306 will increase as the auxiliary segment excitation current $I_{AUX}$ is decreased. As indicated in FIG. 15, the optical signal gain increases with decreasing auxiliary segment excitation current $I_{AUX}$, and for a fixed auxiliary segment excitation current $I_{AUX}$, the output saturation power of the SOA increases with increasing main segment excitation current $I_{MAIN}$. As indicated in FIG. 16, for a fixed auxiliary segment excitation current $I_{AUX}$, the ROF increases and the intensity of the RIN spectrum peak decreases with increased ballast laser output power $P_{LC}$, and therefore decreases with increased main segment excitation current $I_{MAIN}$.

To determine the proper operating point, the auxiliary segment excitation current $I_{AUX}$ is first set at a level corresponding to the known desired gain G of the SOA. Then, for the known signal modulation rate $F_{MOD}$ and the known desired nominal output saturation power $P_{SAT-NOMINAL}$, the main segment excitation current $I_{MAIN}$ is set to a level not less than the greatest of (i) a lasing threshold current sufficient to cause lasing in the ballast laser, (ii) a RIN threshold current $I_{MAINRINTHRESH}$ that causes an ROF sufficiently greater than the modulation rate $F_{MOD}$ such that the RIN spectrum value at $F_{MOD}$ is equal to a predetermined tolerance amount TOL above the low-frequency RIN noise floor, and (iii) a saturation threshold current $I_{MAINSATTHRESH}$ corresponding to an excitation current that yields an output saturation power equal to the nominal SOA saturation output power $P_{SAT-NOMINAL}$. A process following that described supra with respect to FIGS. 7–12 is used to determine the device operating points that satisfy both the output saturation power criterion and the RIN noise criterion. In the event that values for $I_{MAINRINTHRESH}$ and $I_{MAINSATTHRESH}$ cannot be found or are unrealistically high in view of device limitations, it is likely that the combination of the desired signal gain level G and the desired nominal output saturation power $P_{SAT-NOMINAL}$ are beyond the capabilities of the device, in which case one or both of these desired parameters needs to be reassigned. Several iterations may be necessary for differing values of desired gain G and/or nominal output saturation power $P_{SAT-NOMINAL}$ to reach an achievable operating point.

It is to be appreciated that in practical "real-world" implementations there may be some degree of cross-coupling among the various factors that cause the relationships of the conceptual plots of FIGS. 14–16 to vary somewhat. For example, the actual height of the optical signal gain curves gA and gB might not be identical, reflecting that the main segment excitation current $I_{MAIN}$ could have some amount of influence on the signal gain for a fixed auxiliary segment excitation current $I_{AUX}$. As another example, the output saturation powers for operating points B and D might not be identical, reflecting that the auxiliary segment excitation current $I_{AUX}$ could have some amount of influence on the output saturation power for a fixed ballast laser output power $P_{LC}$. Likewise, the RIN spectra for operating points A and C might not have identical shapes or identical ROFs, reflecting that the auxiliary segment excitation current $I_{AUX}$ could have some amount of influence on the RIN spectrum for a fixed ballast laser output power $P_{LC}$. Despite such potential variations, one skilled in the art would be readily able to determine a proper operating point for the ballast-powered SOA 1302 in accordance with the preferred embodiments.

Figure 17:
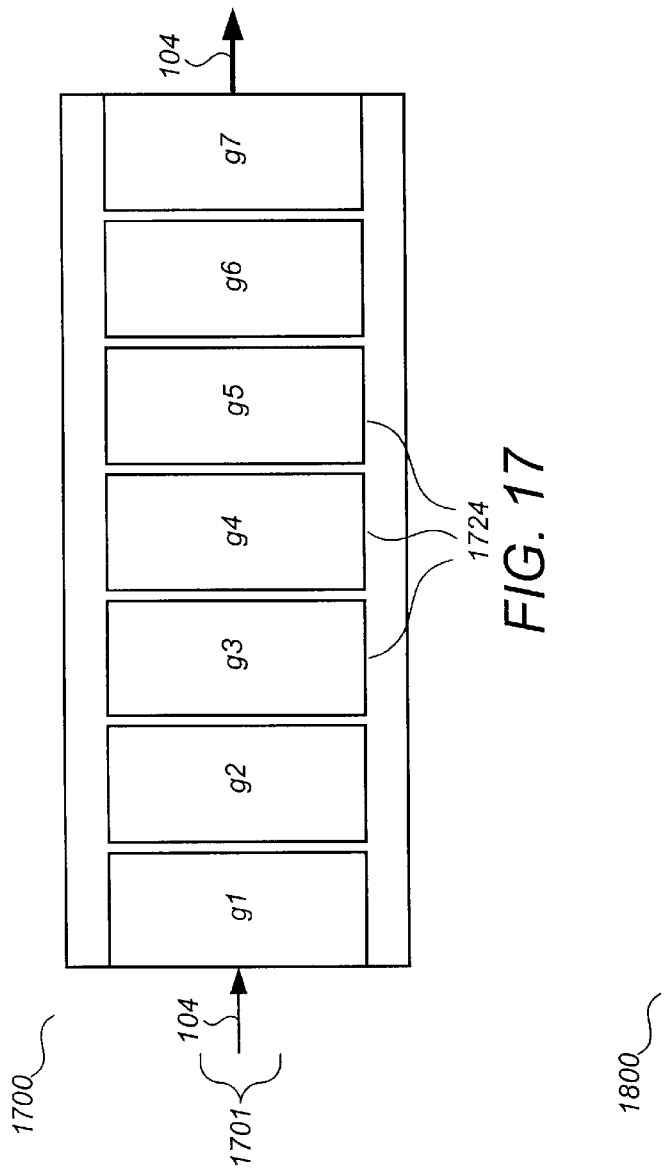
FIGS. 17–19 illustrate top views of ballast powered SOAs in accordance with a preferred embodiment having differing gain profiles.

FIG. 17 illustrates a conceptual top view of a multi-stage ballast powered SOA 1700 in accordance with a preferred embodiment, comprising multiple ballast lasers 1724 positioned transversely to the signal waveguide 1701, each ballast laser being associated with a distinct amplification stage for the optical signal 104. For simplicity of explanation, it is first presumed that the width of each ballast laser 1724, and therefore the longitudinal distance traversed by the optical signal 104 through each respective amplification stage, are identical. The optical signal 104 experiences a gain $g_M$ for the $M^{th}$ ballast laser, where M=1, 2, ..., N, with N being the number of ballast lasers (N=7 in FIG. 17). In accordance with a preferred embodiment, at least one ballast laser nearer to the signal input has a signal gain greater than at least one ballast laser nearer to the signal output, i.e., $g_{M1} > g_{M2}$ where M1<M2. More preferably, $g_1 > g_2 > g_3 ... > g_N$. When this condition is satisfied, it has been found that for the same amount of overall signal gain G collectively yielded by the N amplifier stages, amplified spontaneous emission (ASE) noise in the SOA output is reduced as compared to a configuration in which $g_1 = g_2 = g_3 ... = g_N$.

The ASE noise improvement achieved by successively assigning larger gains to amplifier stages nearer the signal input stems from the operational characteristics of the materials most likely to be used in fabricating the ballast powered SOA 1700, such as those described supra with respect to FIGS. 2A and 2B, in which there has been found to be a sublinear relationship between (i) spontaneous emission noise $ASE_x$ added to the optical signal, and (ii) signal gain $g_x$. By sublinear, it is meant that for a given percentage change in signal gain ($\Delta g_x / g_x$), there is a lesser percentage change in the spontaneous emission noise ($\Delta ASE_x / ASE_x$). See generally Giuliani, G. and D'Alessandro, D., "Noise Analysis of Conventional and Gain-Clamped Semiconductor Optical Amplifiers," J. Lightwave Tech., Vol. 18, No. 9, pp. 1256–1263 (September 2000).

Figure 18:
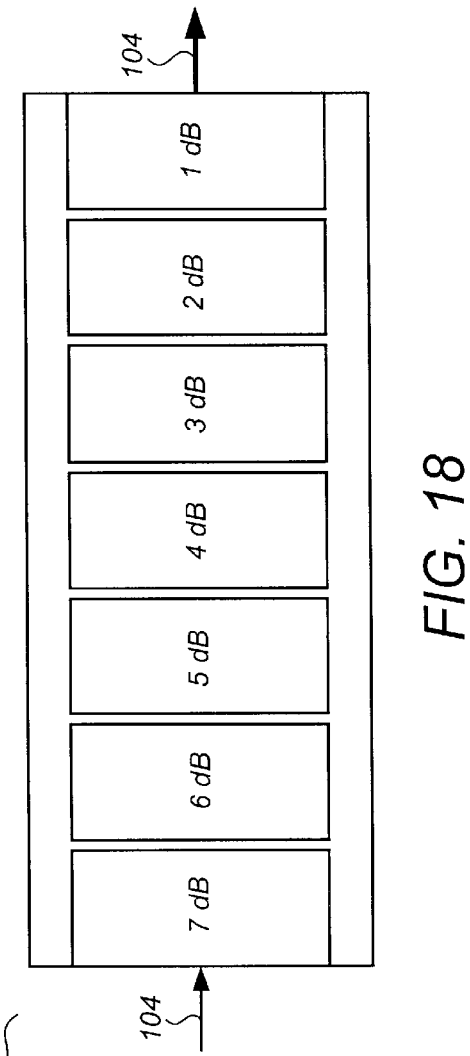
Figure 19:
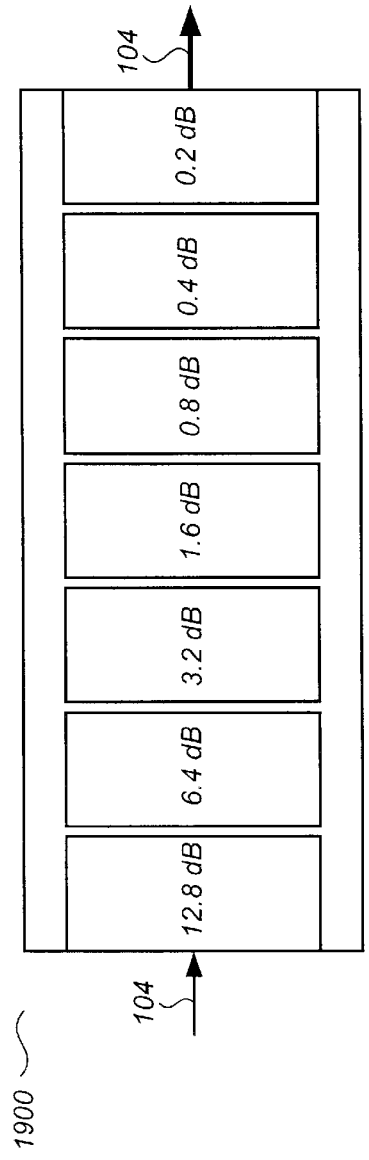

FIGS. 18 and 19 illustrate conceptual plots of multi-stage ballast powered SOAs 1800 and 1900, respectively, each having a gain profile in accordance with a preferred embodiment. The multiple ballast lasers again have identical widths. In FIG. 18, the gains of the respective amplifier stages are 7 dB, 6 dB, 5 dB, 4 dB, 3 dB, 2 dB, and 1 dB, for an overall gain of 28 dB. A measurable reduction in ASE noise is achieved as compared to a multi-stage ballast SOA in which the 28 dB of gain is spread equally among the 7 amplifier stages, each having a gain of 4 dB. In FIG. 19, the gains of the respective amplifier stages are 12.8 dB, 6.4 dB, 3.2 dB, 1.6 dB, 0.8 dB, 0.4 dB, and 0.2 dB, for an overall gain of 25.4 dB. A measurable reduction in ASE noise is achieved as compared to a multi-stage ballast SOA in which the 25.4 dB of gain is spread equally among the 7 amplifier stages, each having a gain of 25.4/7=3.63 dB.

Ballast-powered SOA implementations may more generally have a plurality "N" of amplifier stages in which the associated ballast lasers have differing widths, such that the optical signal travels different distances $d_1, d_2, ..., d_N$ through successive amplification regions. Each amplifier stage "i" causes a signal gain $g_i = \gamma_i d_i$, where $\gamma_i$ is the signal gain per unit distance traveled and $d_i$ is the longitudinal distance traveled by the optical signal through the $i^{th}$ amplification region. In accordance with a preferred embodiment, at least one ballast laser nearer to the signal input has a signal gain per unit distance greater than at least one ballast laser nearer to the signal output, i.e., $\gamma_{M1} > \gamma_{M2}$ where M1<M2. More preferably, $\gamma_1 > \gamma_2 > \gamma_3 ... > \gamma_N$.

Figure 20:
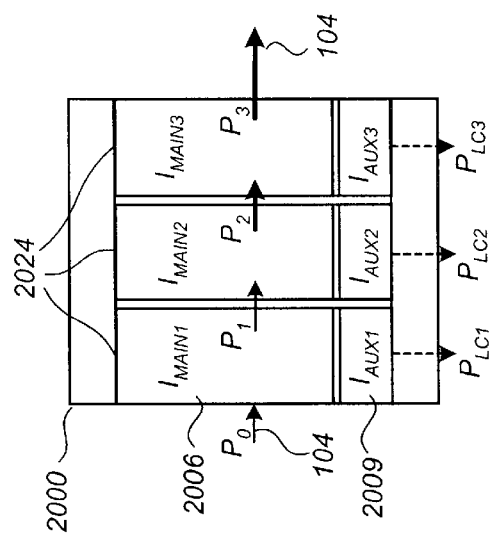
FIG. 20 illustrates a top view of a ballast powered SOA in accordance with a preferred embodiment.

FIG. 20 illustrates a conceptual top view of a multi-stage, multi-segment, ballast-powered SOA 2000 in accordance with a preferred embodiment. While only three ballast lasers, i.e., three amplifier stages, are presented in FIG. 20 it is to be appreciated that many more may be incorporated in accordance with the preferred embodiments. Furthermore, while the simpler case of only two segments per ballast laser is presented in FIG. 20, it is to be appreciated that one skilled in the art could readily extend the system and methods of the preferred embodiments to scenarios involving additional ballast laser segments. Ballast powered SOA 2000 comprises three ballast lasers 2024, each comprising a main segment 2006 and an auxiliary segment 2009. Each respective segment "i" receives an optical signal having power $P_{i-1}$, is biased by a main segment excitation current $I_{MAINi}$ and an auxiliary segment excitation current $I_{AUXi}$, outputs an unused laser signal having a power of $P_{LCi}$, and passes on to the next stage or to the SOA output an amplified optical signal having a power of $P_i$.

In accordance with a preferred embodiment, an operating point for the SOA 2000 is determined in view of a known signal modulation rate $F_{MOD}$, a known desired overall signal gain G, and a known desired nominal output saturation power $P_{SAT-NOMINAL}$. As a starting point, a gain profile $g_1, g_2, ..., g_N$ is assigned whose combination achieves the desired overall gain G and such that $\gamma_1 > \gamma_2 > \gamma_3 ... > \gamma_N$, with $g_i = \gamma_i d_i$, with $\gamma_i$ being the signal gain per unit distance in the $i^{th}$ amplification region, and with $d_i$ being the longitudinal distance through the $i^{th}$ amplification region. Presuming for simplicity that all $d_i$ are equal, this means assigning a gain profile $g_1 > g_2 > ... > g_N$ whose combination achieves the desired overall gain G. Generally speaking, a more extreme gain profile where the sequence $g_1, g_2, ..., g_N$ has a greater variance from the mean G/N achieves better ASE noise reduction than a less extreme gain profile. Next, a set of minimum amplification stage output saturation powers $P_{SAT1}, P_{SAT2}, ..., P_{SATN}$ corresponding to the desired output saturation power $P_{SAT-NOMINAL}$ and to the gain profile $g_1, g_2, ..., g_N$ is determined.

Next, for each ballast laser "i," an auxiliary segment bias current $I_{AUXi}$ that achieves the desired amplifier stage gain $g_i$ is determined. Also for each ballast laser "i," a main segment output saturation threshold current $I_{MAINSATTHRESHi}$ is determined by determining the main segment excitation current $I_{MAINi}$ necessary to result in an output saturation power $P_{SATi}$. For each ballast laser "i," a main segment relative intensity noise (RIN) threshold current $I_{MAINRINTHRESHi}$ is determined by determining the main segment excitation current $I_{MAINi}$ necessary to result in a relaxation oscillation frequency (ROF) greater than the signal modulation rate $F_{MOD}$ such that the RIN spectrum value at $F_{MOD}$ is equal to a predetermined tolerance amount above a low-frequency noise floor of the RIN spectrum. In the event that values for $I_{MAINRINTHRESHi}$ and $I_{MAINSATTHRESHi}$ cannot be found or are unrealistically high in view of device limitations for any given amplifier stage "i", it is likely that the combination of the assigned signal gain level $g_i$ and the resulting required output saturation power $P_{SATi}$ are beyond the capabilities of that amplifier stage. In such case, it is necessary to reassign a different gain profile $g_1, g_2, ..., g_N$ for the overall device, e.g., by selecting a less extreme gain profile having a smaller variance around the mean G/N. An iterative process that will be readily apparent to one skilled in the art in view of the present disclosure is then carried out to determine a suitable operating point meeting the overall ASE noise reduction criterion, the output saturation power criterion for each amplifier stage, the RIN noise criterion for each amplifier stage, and of course the lasing threshold current criterion for each amplifier stage.

Figure 21:
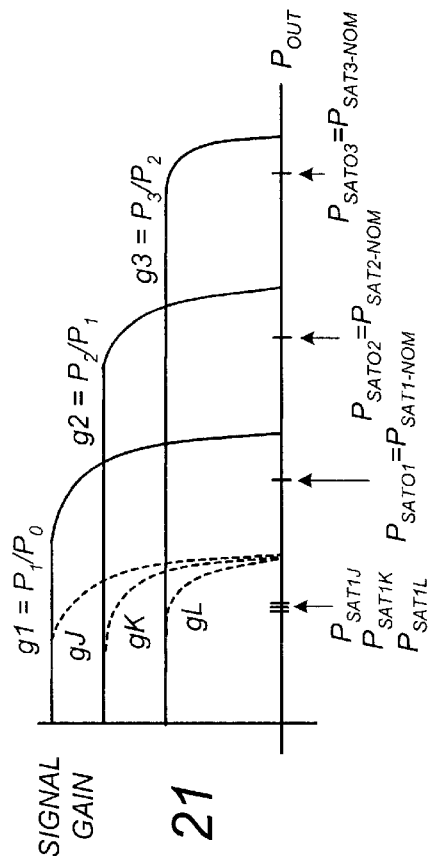
FIG. 21 illustrates conceptual plots of amplification stage gains versus amplification stage output signal power corresponding to different ballast lasers in the SOA of FIG. 20 at different operating points.
Figure 23:
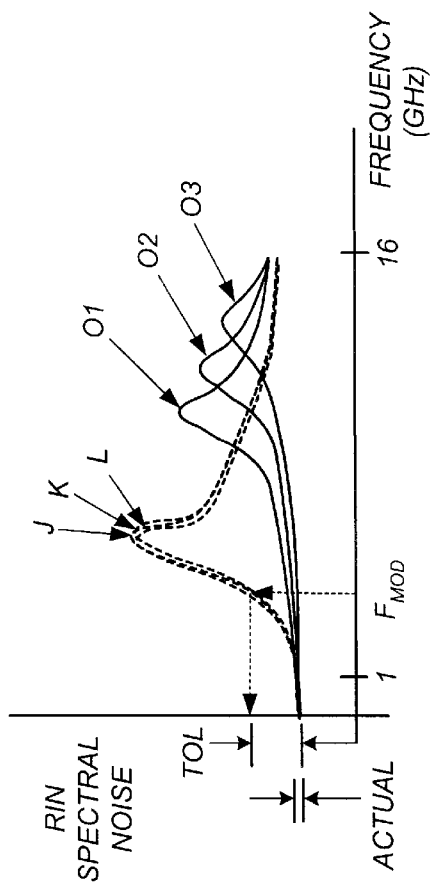
FIG. 23 illustrates conceptual plots of the RIN spectra of the ballast lasers of the SOA of FIG. 20 at different operating points
Figure 22:
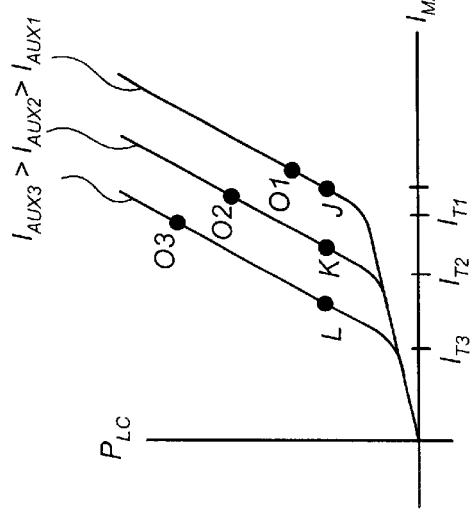
FIG. 22 illustrates conceptual plots of emitted ballast laser power versus main segment excitation current for the different ballast lasers in the SOA of FIG. 20 at different operating points.

FIGS. 21–23, which are presented by way of example only, illustrate conceptual plots of signal gain versus output saturation power, ballast laser output power versus excitation current, and RIN spectra, respectively, for the ballast-powered SOA 2000 at different operating points O1, O2, and O3. The operating points O1, O2, and O3 represent one set of operating points that may be arrived at according to a preferred embodiments, it being appreciated that many different combinations of operating points may satisfy the criteria supra for a given set of desired overall parameters $F_{MOD}$, G, and $P_{SAT\text{-}NOMINAL}$. Roughly speaking, these operating points represent an "output saturation power-limited" scenario where output saturation power limitations, rather than RIN noise limitations, dictate the minimum necessary main segment excitation currents $I_{MAINi}$. Thus, the hypothetical operating points J, K, and L satisfy the RIN criteria for each amplifier stage, as shown in FIG. 23, but they do not satisfy any of the saturation power criteria, as shown in FIG. 21. Accordingly, each of the main segment excitation currents $I_{MAINi}$ is increased until the respective output saturation power criteria are met, with $P_{SAT3\text{-}NOM}$ being equal to $P_{SAT\text{-}NOMINAL}$ of the overall device, resulting in the operating points O1, O2, and O3. Cross-checking again with FIG. 23, it is readily seen that the RIN noise criteria are even better satisfied by the operating points O1, O2, and O3.

Figure 24:
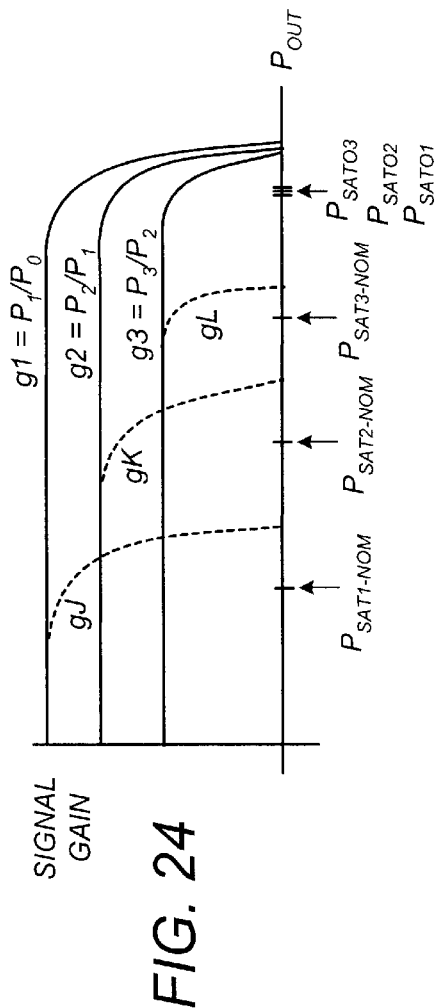
FIG. 24 illustrates conceptual plots of amplification stage gains versus amplification stage output signal power corresponding to different ballast lasers in the SOA of FIG. 20 at different operating points.
Figure 26:
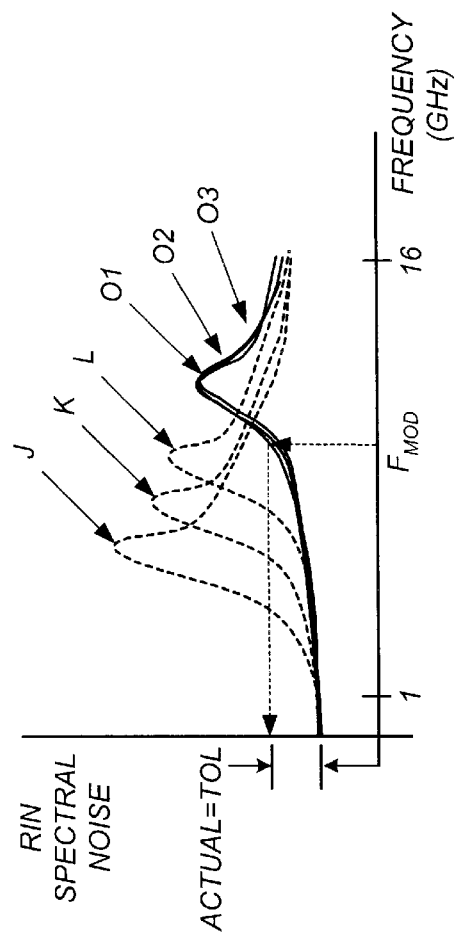
FIG. 26 illustrates conceptual plots of the RIN spectra of the ballast lasers of the SOA of FIG. 20 at different operating points.
Figure 25:
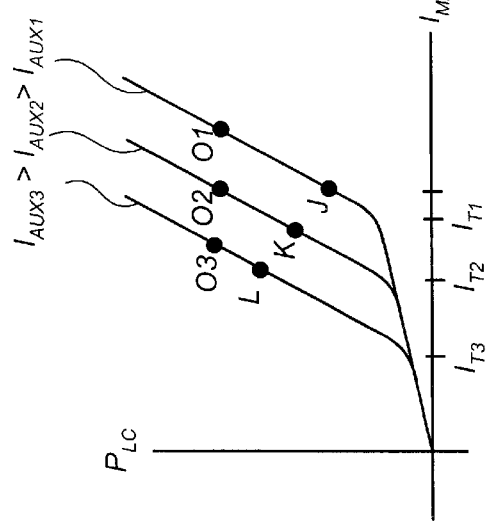
FIG. 25 illustrates conceptual plots of emitted ballast laser power versus main segment excitation current for the different ballast lasers in the SOA of FIG. 20 at different operating points.

FIGS. 24–26, which are presented by way of example only, illustrate conceptual plots analogous to FIGS. 21–23 except that, roughly speaking, the operating points O1, O2, and O3 represent a "RIN noise-limited" scenario. Here, the hypothetical operating points J, K, and L satisfy the output saturation power criteria for each amplifier stage, as shown in FIG. 24, but they do not satisfy any of the RIN noise criteria, as shown in FIG. 26. Accordingly, each of the main segment excitation currents $I_{MAINi}$ is increased until the respective RIN noise criteria are met, resulting in the operating points O1, O2, and O3. Cross-checking again with FIG. 24, it is readily seen that the output saturation power criteria are even better satisfied by the operating points O1, O2, and O3.

Figure 27:
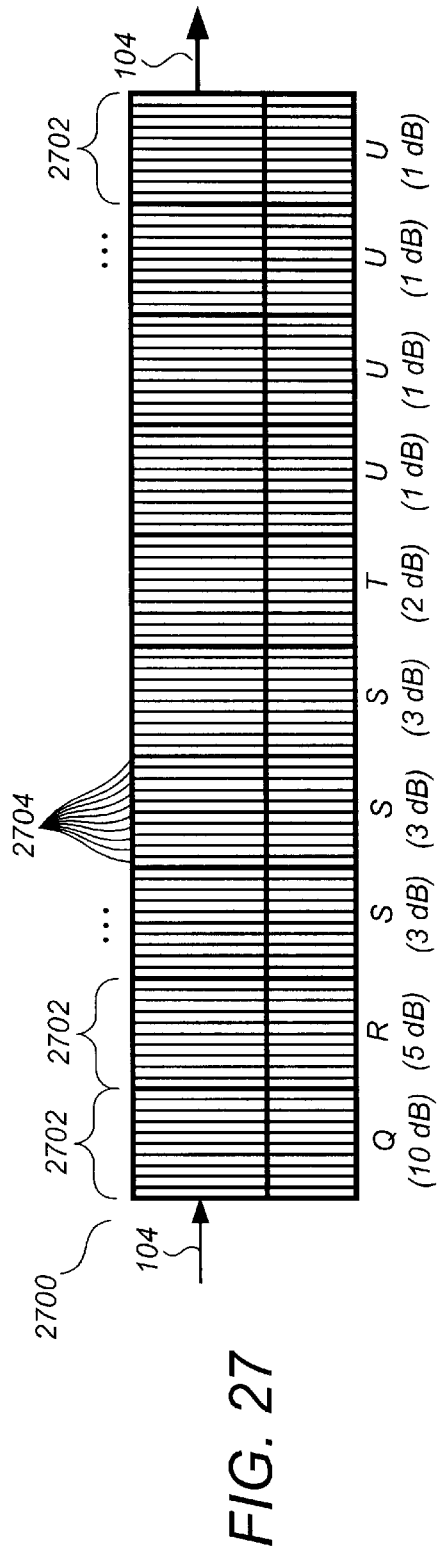
FIG. 27 illustrates a top view of a ballast powered SOA in accordance with a preferred embodiment.

FIG. 27 illustrates a top view of a ballast-powered SOA 2700 according to a preferred embodiment. Ballast-powered SOA 2700 represents one particular set of dimensions, nominal gain values, and biasing points that can be used for a ballast-powered SOA according to the preferred embodiments in view of an example set of device material characteristics, and is presented by way of example and not by way of limitation. Ballast-powered SOA 2700 comprises ten (10) transverse ballast laser groups 2702, each comprising ten (10) individual transverse ballast lasers 2704, positioned along a signal waveguide such that the optical signal 104 is amplified using energy from the ballast lasers 2704 as it is guided along the signal waveguide. The coextensive signal waveguide/gain medium embodiment of FIG. 2A or the evanescent-coupled embodiment of FIG. 2B may be used. For purposes of simplicity and clarity of disclosure, it is presumed that all ballast lasers 2704 are substantially identical to each other, although it is to be appreciated that the scope of the preferred embodiments extends to differently sized and dimensioned transverse ballast lasers.

The ten (10) members of each ballast laser group 2702 are each biased with a substantially identical set of bias currents. As will be detailed further below, the ballast lasers of a first transverse ballast group are each biased at an operating point Q such that an overall gain for that ballast laser group is 10 dB. The next ballast laser group is biased at an operating point R for an overall gain of 5 dB. The next three ballast laser groups are each biased at an operating point S for a gain of 3 dB. The next ballast laser group is biased at an operating point T for a gain of 2 dB. Finally, the last four ballast laser groups are each biased at an operating point U for a gain of 1 dB.

Figure 28:
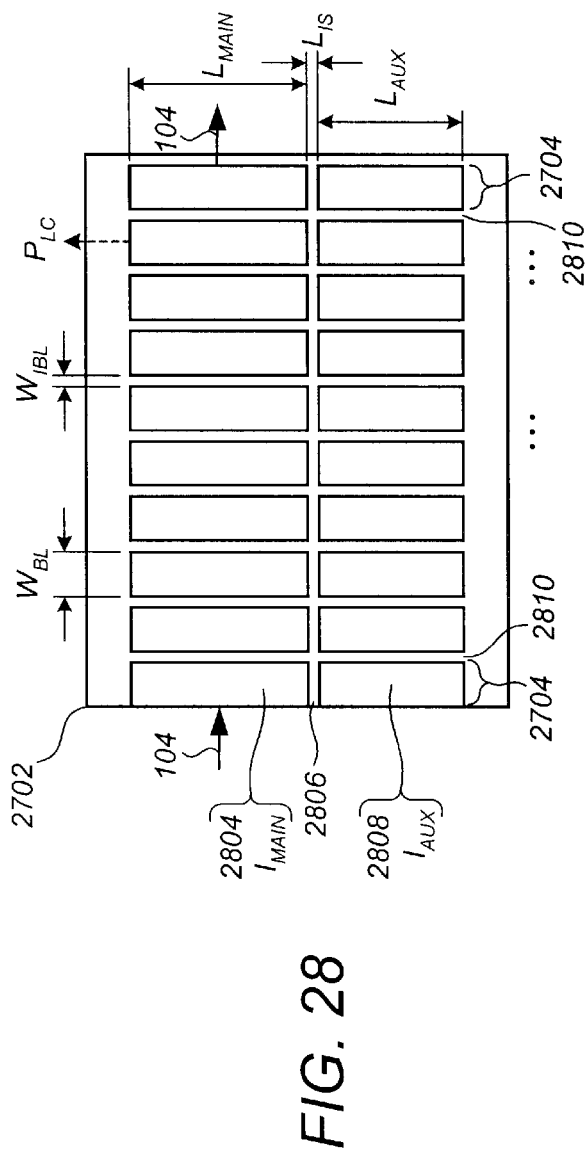
FIG. 28 illustrates a top view of a portion of the ballast powered SOA of FIG. 27 in accordance with a preferred embodiment.

FIG. 28 illustrates a closer top view of one of the ballast laser groups 2702. Each ballast laser group comprises ten (10) individual ballast lasers 2704, each comprising a main segment 2804 and an auxiliary segment 2808 separated by an inter-segment region 2806. For purposes of this example, it is presumed that the material characteristics of the SOA 2702 are as follows. The linear material gain of the gain medium itself, denoted herein by "g" such that (output power)/(input power)=$e^{gD}$, is adjustable from 2900 cm$^{-1}$ (1.26 dB/$\mu$m) at a first excitation current down to about 830 cm$^{-1}$ (0.36 dB/$\mu$m) at a second excitation current less than the first excitation current. The SOA 2702 is constructed such that the electric field of a traveling optical wave (the ballast lasing fields as well as the optical signal 104 itself) will "see" approximately 10% of the material gain, yielding a modal gain "g" of 290 cm$^{-1}$ (0.126 dB/$\mu$m) for the first excitation current and 83 cm$^{-1}$ (0.036 dB/$\mu$m) for the second excitation current. When the gain medium has an excitation current of zero, a modal loss of 300 cm$^{-1}$ (-0.13 dB/$\mu$m) is presumed. The width $W_{BL}$ of each ballast laser 2704 is about 10 $\mu$m in order to inhibit filamentation and other parasitic lasing modes. The inter-ballast laser connecting zone width $W_{IBL}$ is about 2 $\mu$m so as to provide sufficient optical and electrical isolation between neighboring ballast lasers. The length $L_{MAIN}$ of each main segment 2804 is about 30 $\mu$m, the length $L_{AUX}$ of each auxiliary segment is about 20 $\mu$m, and the length $L_{IS}$ of each inter-segment region 2806 is about 1 $\mu$m.

Figure 29:
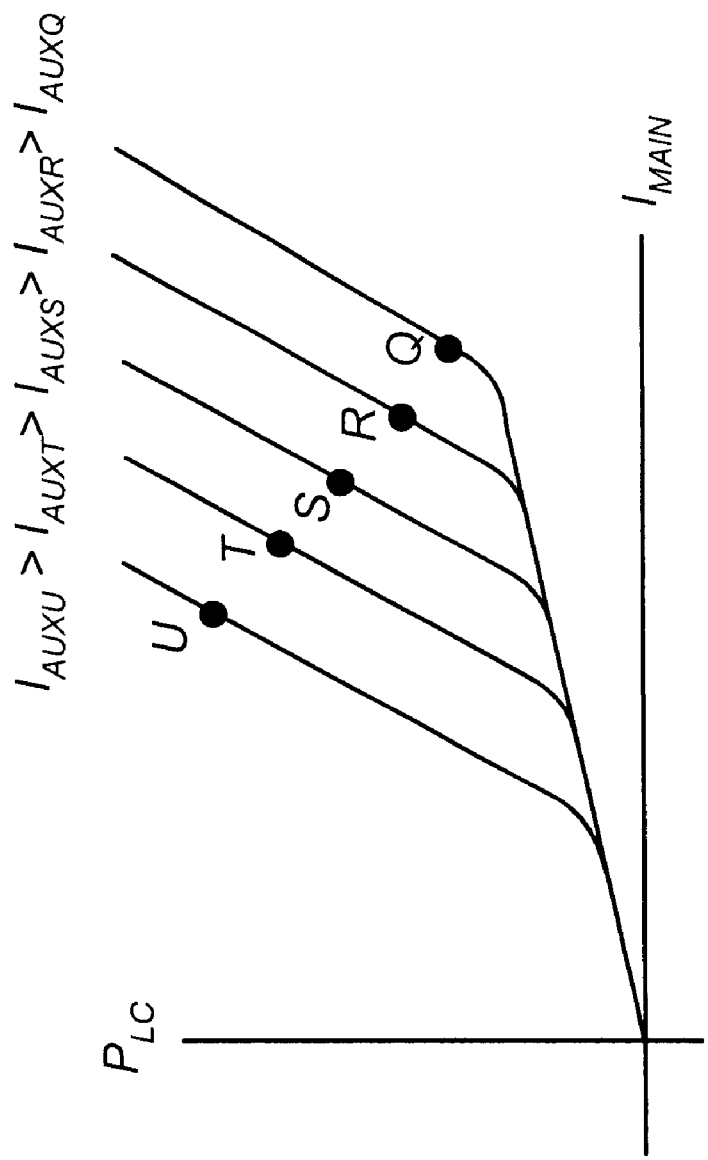
FIG. 29 illustrates conceptual plots of emitted ballast laser power versus main segment excitation current for the different ballast lasers of the SOA of FIGS. 27–28.

FIG. 29 illustrates conceptual plots of emitted ballast laser power $P_{LC}$ versus main segment excitation current for individual lasers within the ballast-powered SOA 2702. The particular operating points Q, R, S, T, and U as shown in FIG. 29 indicate that the required auxiliary currents $I_{AUX}$ are increased to achieve decreasing gains from points Q to U. While the main segment currents $I_{MAIN}$ are decreased from points Q to U, they are carefully selected such that the emitted ballast power $P_{LC}$ increases from points Q to U, which is consistent with the need for increased output saturation power. For the purposes of FIGS. 27–29, it is presumed that device operation lies well within RIN noise limitations.

TABLE 1 below illustrates a summary of the operating points, gains, and losses associated with the operating points Q through U of FIG. 29. TABLE 2 below illustrates a summary of operating points in a comparison scenario in which all ballast laser groups have the same gain of 3 dB (i.e., are fixed at operating point "S") throughout the whole device, which yields the same overall gain of 30 dB. It has been found that noise performance can improve by up to +1.8 dB by varying the gain profile according to TABLE 1 as opposed to using the gain profile of TABLE 2.

TABLE 1

Operating Characteristics for FIGS. 27 and 29

| Ballast Laser Group/ Operating Point | Main Segment Current | Modal Gain (dB/μm) | Gross Gain per Group of 10 (dB) | Conn. Zone Loss (dB/μm) | Loss per Group of 10 (dB) | Net Gain per Group of 10 (dB) |
|---|---|---|---|---|---|---|
| Q | $I_{MAINQ}$ | 0.126 | 12.6 | 0.130 | 2.6 | 10 |
| R | $I_{MAINR}$ | 0.076 | 7.6 | 0.130 | 2.6 | 5 |
| S | $I_{MAINS}$ | 0.056 | 5.6 | 0.130 | 2.6 | 3 |
| S | $I_{MAINS}$ | 0.056 | 5.6 | 0.130 | 2.6 | 3 |
| S | $I_{MAINS}$ | 0.056 | 5.6 | 0.130 | 2.6 | 3 |
| T | $I_{MAINT}$ | 0.046 | 4.6 | 0.130 | 2.6 | 2 |
| U | $I_{MAINU}$ | 0.036 | 3.6 | 0.130 | 2.6 | 1 |
| U | $I_{MAINU}$ | 0.036 | 3.6 | 0.130 | 2.6 | 1 |
| U | $I_{MAINU}$ | 0.036 | 3.6 | 0.130 | 2.6 | 1 |
| U | $I_{MAINU}$ | 0.036 | 3.6 | 0.130 | 2.6 | 1 |
| TOTAL | | | 66 | | 36 | 30 |

TABLE 2

Comparison Characteristics

| Ballast Laser Group/ Operating Point | Main Segment Current | Modal Gain (dB/μm) | Gross Gain per Group of 10 (dB) | Conn. Zone Loss (dB/μm) | Loss per Group of 10 (dB) | Net Gain per Group of 10 (dB) |
|---|---|---|---|---|---|---|
| S | $I_{MAINS}$ | 0.056 | 5.6 | 0.130 | 2.6 | 3 |
| S | $I_{MAINS}$ | 0.056 | 5.6 | 0.130 | 2.6 | 3 |
| S | $I_{MAINS}$ | 0.056 | 5.6 | 0.130 | 2.6 | 3 |
| S | $I_{MAINS}$ | 0.056 | 5.6 | 0.130 | 2.6 | 3 |
| S | $I_{MAINS}$ | 0.056 | 5.6 | 0.130 | 2.6 | 3 |
| S | $I_{MAINS}$ | 0.056 | 5.6 | 0.130 | 2.6 | 3 |
| S | $I_{MAINS}$ | 0.056 | 5.6 | 0.130 | 2.6 | 3 |
| S | $I_{MAINS}$ | 0.056 | 5.6 | 0.130 | 2.6 | 3 |
| S | $I_{MAINS}$ | 0.056 | 5.6 | 0.130 | 2.6 | 3 |
| S | $I_{MAINS}$ | 0.056 | 5.6 | 0.130 | 2.6 | 3 |
| TOTAL | | | 66 | | 36 | 30 |

A ballast-powered SOA according to the preferred embodiments is robust against fabrication defects that may yield local "hot spots" in a given transverse ballast laser. According to a preferred embodiment, after fabrication of the device, each transverse ballast laser 2704 is individually tested. If all ten ballast lasers of a given ballast laser group 2702 are non-defective, their electrical contacts are tied together, that is, all main nodes supplying $I_{MAIN}$ are coupled to a first external node and all auxiliary nodes supplying $I_{AUX}$ are coupled to a second external node. However, if a given transverse ballast laser is found to contain one or more "hot spots," that transverse ballast laser is electrically isolated from the other ballast lasers and is provided with a reduced excitation current by insertion of an appropriate resistance in the electrical excitation circuit.

Whereas many alterations and modifications of the present invention will no doubt become apparent to a person of ordinary skill in the art after having read the foregoing description, it is to be understood that the particular embodiments shown and described by way of illustration are in no way intended to be considered limiting. It is to be appreciated that the various scenarios supra are given by way of example only, and that many other scenarios involving more complex situations are within the scope of the preferred embodiments and would be readily apparent to a person skilled in the art in view of the present disclosure. It is to be further appreciated that the systems and methods of the preferred embodiments are readily applicable even if data corresponding to "real-world" implementations varies somewhat from the particular conceptual curves presented supra in terms of their shapes, their specific values at particular points, their particular migratory patterns, etc. Although some degree of empirical iteration among the various operating characteristics and performance criteria described supra (e.g., gain profile, main excitation currents, auxiliary excitation currents, lasing, RIN performance, saturation performance, etc.) might be required to find a suitable operating point, such empirical iterative methods would be readily apparent to a person skilled in the art in view of the present disclosure and are within the scope of the preferred embodiments. Therefore, reference to the details of the preferred embodiments is not intended to limit their scope.

What is claimed is:

1. A semiconductor optical amplifier (SOA) for amplifying an optical signal having a first modulation rate, comprising:
 a signal waveguide; and
 a laser cavity positioned with respect to said signal waveguide such that an optical signal traveling along said signal waveguide is amplified using energy provided by said laser cavity, said laser cavity having a relaxation oscillation noise (RIN) spectrum, said RIN spectrum having a low-frequency noise floor and a maximum at a relaxation oscillation frequency (ROF);

wherein said laser cavity is biased with an excitation current greater than a RIN threshold current, said RIN threshold current being that excitation current that results in an ROF sufficiently greater than said first modulation rate such that said RIN spectrum has a value at said first modulation rate equal to a predetermined tolerance amount above said low-frequency noise floor.

2. The SOA of claim 1, wherein said predetermined tolerance amount is not less than 6 dB/Hz.

3. The SOA of claim 1, said signal waveguide including a signal guiding layer, said laser cavity including an active layer, said active layer being separate from said signal guiding layer, wherein said active layer is positioned sufficiently near said signal guiding layer such that the optical signal traveling along said signal guiding layer is amplified by an evanescent coupling effect with said active layer.

4. The SOA of claim 1, said signal waveguide including a signal guiding layer comprising a gain medium, said laser cavity including an active layer that is coextensive with said gain medium of said signal guiding layer at one or more regions of intersection between said signal waveguide and said laser cavity.

5. The SOA of claim 1, said SOA having a nominal output saturation power, wherein said excitation current is not less than the greater of (i) said RIN threshold current and (ii) a saturation threshold current, said saturation threshold current being that excitation current that results in an output saturation power equal to said nominal output saturation power.

6. The SOA of claim 1, said laser cavity comprising multiple segments including a main segment whose lasing field couples with the optical signal and an auxiliary segment, said main segment and said auxiliary segment being optically contiguous but substantially electrically isolated and supplied with separate excitation currents, a gain value of said SOA varying according to said auxiliary segment excitation current, wherein said main segment excitation current is greater than a main RIN threshold current for that gain value, said main RIN threshold current being that main segment excitation current that, for that gain value, results in an ROF sufficiently greater than said first modulation rate such that said RIN spectrum has a value at said first modulation rate equal to a predetermined tolerance amount above said low-frequency noise floor.

7. The SOA of claim 6, said SOA having a nominal output saturation power, wherein said main segment excitation current is not less than the greater of (i) said main RIN threshold current and (ii) a main saturation threshold current, said main saturation threshold current being that main segment excitation current that results in an output saturation power equal to said nominal output saturation power.

8. The SOA of claim 1, said SOA having a nominal output saturation power, said laser cavity consisting of a single segment, said laser cavity having a gain that remains substantially constant as said excitation current surpasses a lasing threshold, said laser cavity having an output saturation power that increases with increasing excitation current past said lasing threshold, wherein said excitation current is maintained at a level not less than the greater of (i) said RIN threshold current and (ii) a saturation threshold current, said saturation threshold current being that excitation current that results in an output saturation power equal to said nominal output saturation power.

9. A monolithic integrated semiconductor optical amplifier (SOA) for amplifying an optical signal, the SOA comprising:

a signal waveguide extending between an input facet and an output facet and defining an optical signal path therebetween; and a plurality of ballast lasers extending across said optical signal path, each ballast laser defining a distinct amplification region where vertically coincident with said signal waveguide, each ballast laser being positioned with respect to said signal waveguide in said amplification region such that the optical signal is amplified therein using energy provided by said ballast laser, said plurality of ballast lasers including a first ballast laser and a second ballast laser, said first ballast laser being positioned nearer to said input facet than said second ballast laser;

wherein said first ballast laser is configured to cause a greater optical signal gain per unit distance in its associated amplification region than said second ballast laser.

10. The SOA of claim 9, wherein each ballast laser positioned nearer to said input facet is configured to cause a greater optical signal gain per unit distance in its associated amplification region than each ballast laser positioned farther from said input facet.

11. The SOA of claim 9, said optical signal being modulated at a first modulation rate, each ballast laser having a relaxation oscillation noise (RIN) spectrum including a low-frequency noise floor and a maximum at a relaxation oscillation frequency (ROF), wherein said ballast laser is biased with an excitation current greater than a RIN threshold current, said RUN threshold current being that excitation current that results in an ROF sufficiently greater than said first modulation rate such that said RIN spectrum has a value at said first modulation rate equal to a predetermined tolerance amount above said low-frequency noise floor.

12. The SOA of claim 11, wherein said predetermined tolerance amount is not less than 6 dB/Hz.

13. The SOA of claim 11, each ballast laser having an associated nominal output saturation power for its respective amplification region, wherein said excitation current is not less than the greater of (i) said RIN threshold current for that ballast laser, and (ii) a saturation threshold current for that ballast laser, said saturation threshold current being that excitation current that results in an output saturation power equal to said nominal output saturation power for that ballast laser's amplification region.

14. The SOA of claim 9, said optical signal being modulated at a first modulation rate, each ballast laser having a relaxation oscillation noise (RIN) spectrum including a low-frequency noise floor and a maximum at a relaxation oscillation frequency (ROF), each ballast laser comprising multiple segments including a main segment that includes said amplification region and an auxiliary segment, said main segment and said auxiliary segment being optically contiguous but substantially electrically isolated and supplied with separate excitation currents including a main segment excitation current and an auxiliary segment excitation current, said gain per unit distance in said amplification region and a gain value for said amplification region varying according to said auxiliary segment excitation current, wherein said main segment excitation current is maintained to be greater than a main RIN threshold current for that gain value, said main RUN threshold current being that main segment excitation current that, for that gain value, results in an ROF sufficiently greater than said first modulation rate such that said RIN spectrum has a value at said first modulation rate equal to a predetermined tolerance amount above said low-frequency noise floor.

15. The SOA of claim 14, wherein said predetermined tolerance amount is not less than 6 dB/Hz.

16. The SOA of claim 14, each ballast laser having an associated nominal output saturation power for its respective amplification region, wherein said main segment excitation current is not less than the greater of (i) said main RIN threshold current for that ballast laser, and (ii) a main segment saturation threshold current for that ballast laser, said main segment saturation threshold current being that main segment excitation current that results in an output saturation power equal to said nominal output saturation power for that ballast laser's amplification region.

17. The SOA of claim 9, said signal waveguide including a signal guiding layer, each of said ballast lasers including an active layer, said active layer being separate from said signal guiding layer, wherein said active layer is positioned sufficiently near said signal guiding layer in said amplifications regions such that the optical signal is amplified by an evanescent coupling effect with said active layer in said amplifications regions.

18. The SOA of claim 9, said signal waveguide including a signal guiding layer comprising a gain medium, each of said ballast lasers including an active layer that is coextensive with said gain medium of said signal guiding layer in said amplification regions.

19. A method of operating a monolithic, integrated, ballast-powered semiconductor optical amplifier (SOA), the SOA having a signal waveguide defining an optical signal path between an input and an output, the SOA further comprising "N" amplification stages formed by "N" ballast lasers positioned across the optical signal path, each ballast laser comprising multiple electrical segments including a main segment that powers the amplification stage and an auxiliary segment, comprising:

receiving a signal modulation rate F, a desired overall gain G, and a desired output saturation power $P_{SAT}$;

assigning a gain profile $g_1, g_2, \ldots, g_N$ for successive amplifier stages whose combination achieves the desired overall gain G;

computing a set of minimum amplification stage output saturation powers $P_{SAT1}, P_{SAT2}, \ldots, P_{SATN}$ corresponding to said desired output saturation power $P_{SAT}$ and to said gain profile $g_1, g_2, \ldots, g_N$;

for each ballast laser "i," determining an auxiliary segment bias current $I_{AUXi}$ that achieves the desired amplifier stage gain $g_i$;

for each ballast laser "i," determining a main segment output saturation threshold current $I_{MAINSATTHRESHi}$ by determining the main segment excitation current $I_{MAINi}$ necessary to result in a stage output saturation power of $P_{SATi}$;

for each ballast laser "i," determining a main segment relative intensity noise (RIN) threshold current $I_{MAINRINTHRESHi}$ by determining the main segment excitation current $I_{MAINi}$ necessary to result in a relaxation oscillation frequency (ROF) greater than the signal modulation rate F such that a RIN spectrum value at the modulation rate F is equal to a predetermined tolerance amount above a low-frequency noise floor of the RIN spectrum;

supplying each ballast laser "i" with said auxiliary segment threshold current of $I_{AUXi}$; and supplying each ballast laser "i" with a main segment threshold current that is not less than the greater of (i) said main segment output saturation threshold current $I_{MAINSATTHRESHi}$ and (ii) said main segment RIN threshold current $I_{MAINRINTHRESHi}$.

20. The method of claim 19, wherein said step of assigning a gain profile includes the step of ensuring that gain per unit distance in each amplification stage nearer to the input is greater than gain per unit distance in each amplification stage nearer to the output.

\* \* \* \* \*